(12) United States Patent
Berry et al.

(10) Patent No.: US 8,587,331 B2
(45) Date of Patent: Nov. 19, 2013

(54) TEST SYSTEMS AND METHODS FOR TESTING ELECTRONIC DEVICES

(76) Inventors: Tommie E. Berry, Livermore, CA (US); Keith J. Breinlinger, San Ramon, CA (US); Eric D. Hobbs, Livermore, CA (US); Marc Loranger, Livermore, CA (US); Alexander H. Slocum, Bow, NH (US); Adrian S. Wilson, Livermore, CA (US)

( * ) Notice: Subject to any disclaimer, the term of this patent is extended or adjusted under 35 U.S.C. 154(b) by 326 days.

(21) Appl. No.: 12/979,159

(22) Filed: Dec. 27, 2010

(65) Prior Publication Data

US 2011/0156734 A1   Jun. 30, 2011

Related U.S. Application Data

(60) Provisional application No. 61/291,826, filed on Dec. 31, 2009, provisional application No. 61/295,945, filed on Jan. 18, 2010.

(51) Int. Cl.
*G01R 31/00* (2006.01)

(52) U.S. Cl.
USPC ...................................................... 324/750.16

(58) Field of Classification Search
USPC ...................................................... 324/750.19
See application file for complete search history.

(56) References Cited

U.S. PATENT DOCUMENTS

| | | | |
|---|---|---|---|
| 4,907,931 A | 3/1990 | Mallory et al. | |
| 5,670,888 A | 9/1997 | Cheng | |
| 5,955,877 A * | 9/1999 | Farnworth et al. | 324/750.23 |
| 6,043,667 A * | 3/2000 | Cadwallader et al. | 324/750.19 |
| 6,064,217 A | 5/2000 | Smith | |
| 6,137,303 A | 10/2000 | Deckert et al. | |
| 6,162,006 A | 12/2000 | Stevens et al. | |
| 6,164,894 A | 12/2000 | Cheng | |
| 6,229,319 B1 * | 5/2001 | Johnson | 324/754.09 |
| 6,313,651 B1 * | 11/2001 | Hembree et al. | 324/756.02 |
| 6,492,187 B1 * | 12/2002 | Farnworth et al. | 438/15 |
| 7,241,993 B2 * | 7/2007 | Nakasuji et al. | 250/310 |
| 7,439,752 B2 * | 10/2008 | Cram et al. | 324/756.02 |
| 7,541,822 B2 | 6/2009 | Uher et al. | |

(Continued)

OTHER PUBLICATIONS

Int'l Search Report, PCT/US2010/062256 (Sep. 1, 2011), 3 pages.

(Continued)

*Primary Examiner* — Jermele M Hollington
*Assistant Examiner* — Demetrius Pretlow
(74) *Attorney, Agent, or Firm* — Kirton McConkie

(57) ABSTRACT

Devices under test (DUTs) can be tested in a test system that includes an aligner and test cells. A DUT can be moved into and clamped in an aligned position on a carrier in the aligner. In the align position, electrically conductive terminals of the DUT can be in a predetermined position with respect to carrier alignment features of the carrier. The DUT/carrier combination can then be moved from the aligner into one of the test cells, where alignment features of the carrier are mechanically coupled with alignment features of a contactor in the test cell. The mechanical coupling automatically aligns terminals of the DUT with probes of the contactor. The probes thus contact and make electrical connections with the terminals of the DUT. The DUT is then tested. The aligner and each of the test cells can be separate and independent devices so that a DUT can be aligned in the aligner while other DUTs, having previously been aligned to a carrier in the aligner, are tested in a test cell.

35 Claims, 16 Drawing Sheets

(56) References Cited

U.S. PATENT DOCUMENTS

| | | | |
|---|---|---|---|
| 7,701,236 B2 * | 4/2010 | Akiyama et al. | 324/750.16 |
| 7,717,661 B1 | 5/2010 | Aho et al. | |
| 8,022,719 B2 * | 9/2011 | Tomita et al. | 324/756.02 |
| 2002/0146970 A1 * | 10/2002 | Saldana et al. | 451/285 |
| 2002/0196047 A1 | 12/2002 | Doherty et al. | |
| 2008/0030213 A1 * | 2/2008 | Sinsheimer | 324/758 |
| 2008/0157791 A1 * | 7/2008 | Hobbs et al. | 324/754 |
| 2008/0238460 A1 * | 10/2008 | Kress et al. | 324/758 |
| 2010/0045323 A1 * | 2/2010 | Nappen et al. | 324/758 |

OTHER PUBLICATIONS

Written Opinion of the Int'l Searching Authority, PCT/US2010/062256 (Sep. 1, 2011), 5 pages.

* cited by examiner

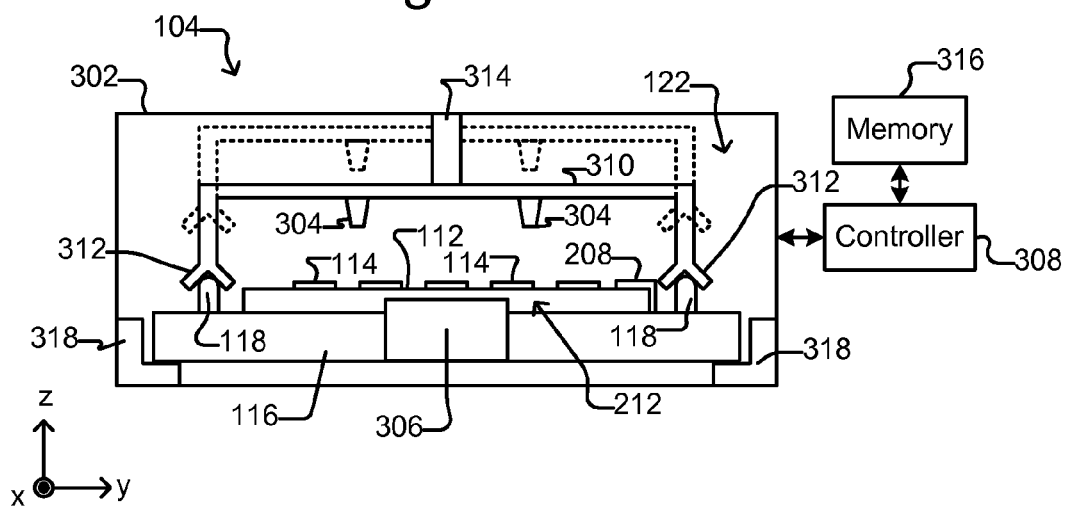

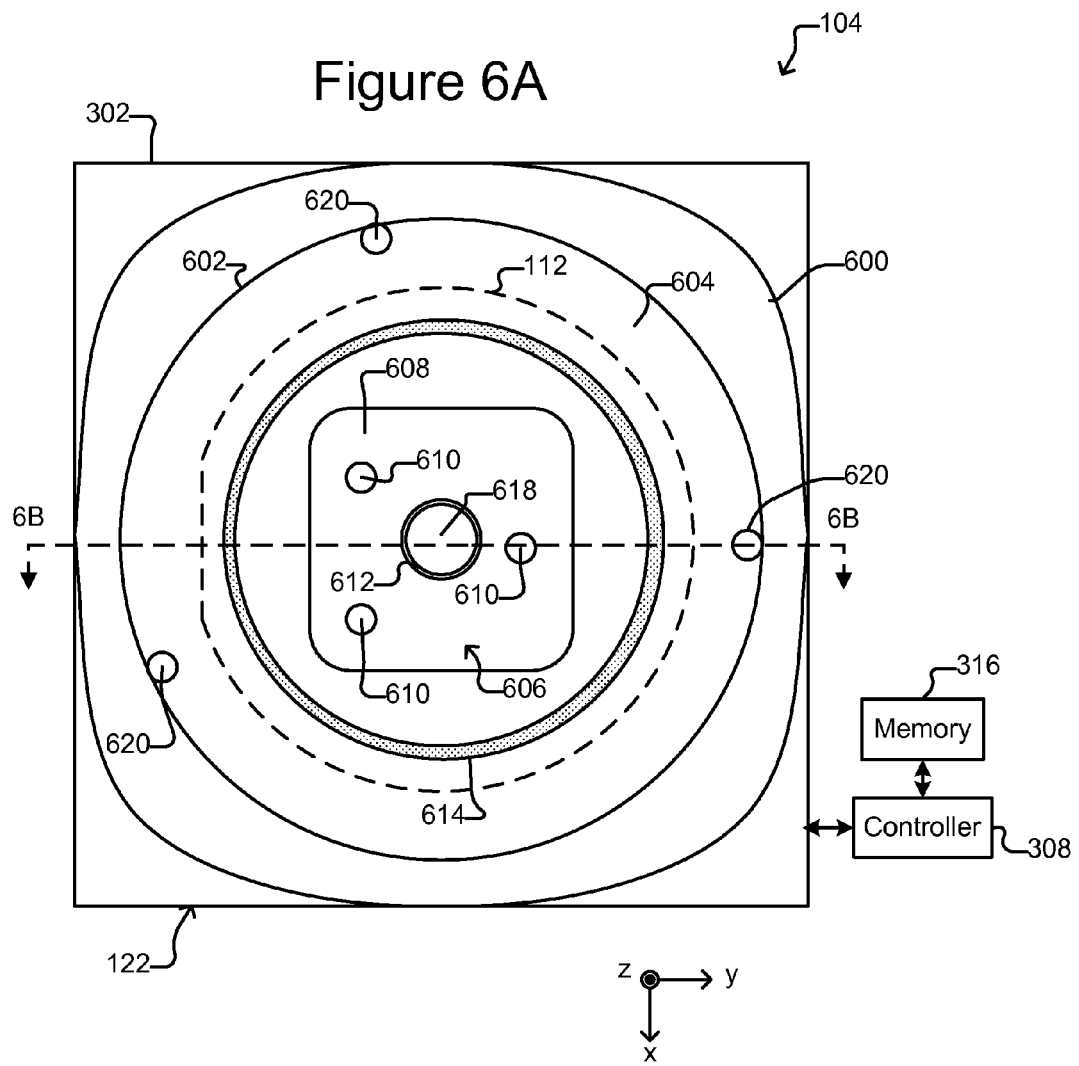

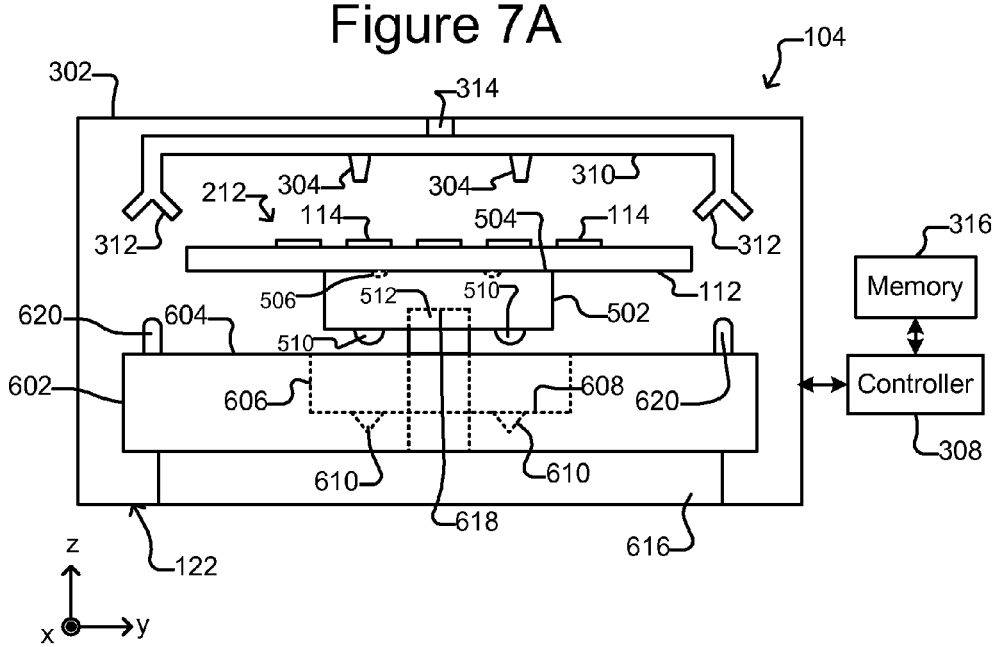
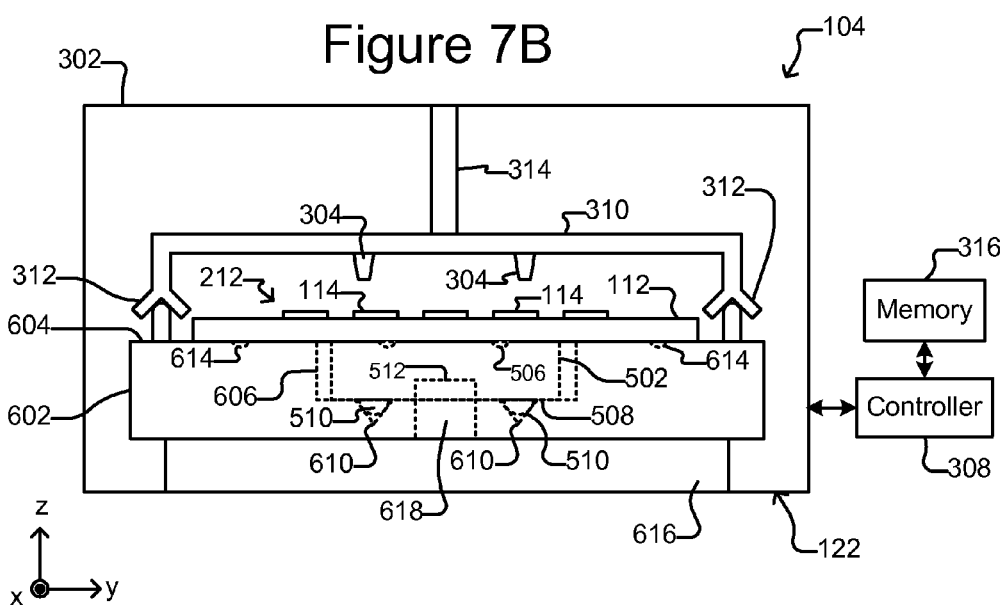

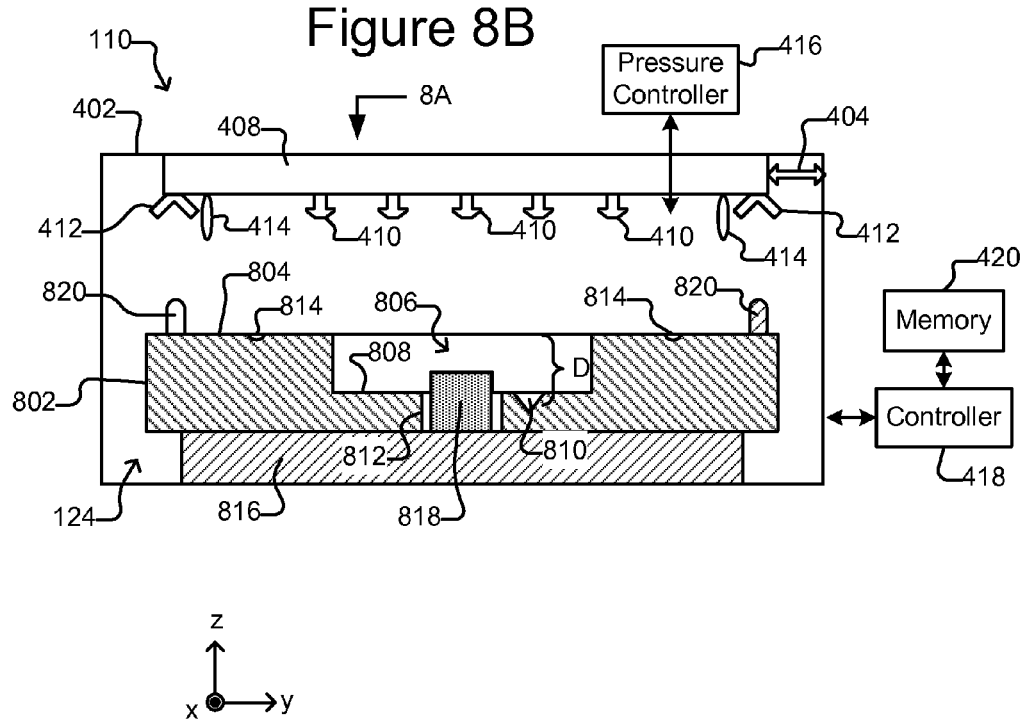

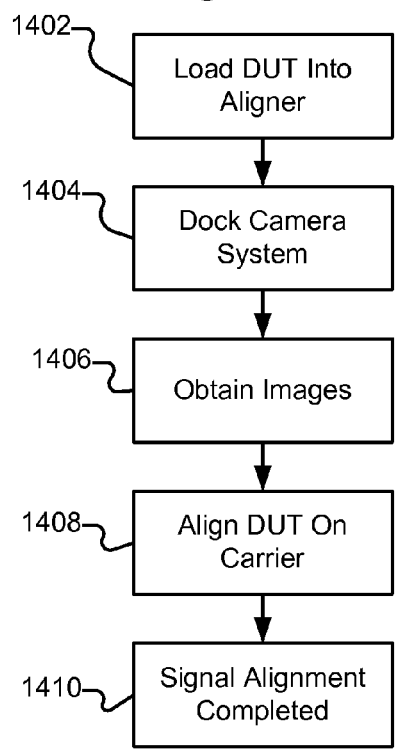
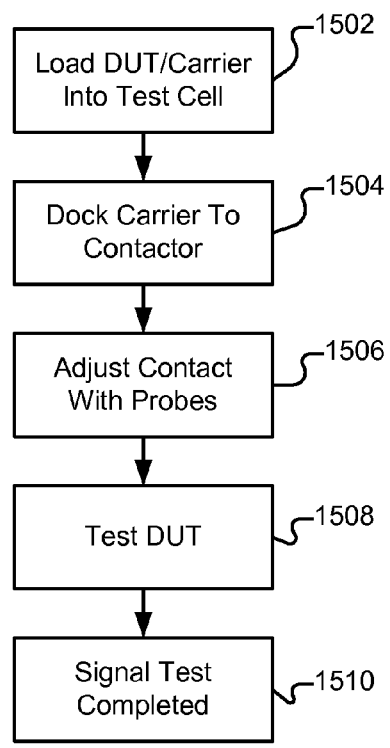
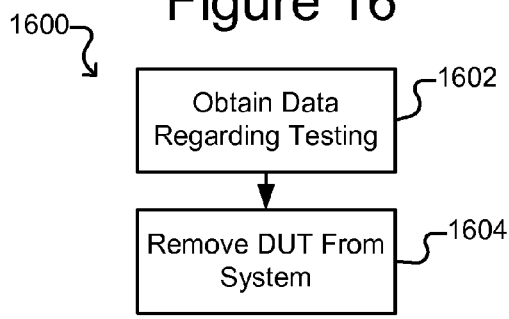

TEST SYSTEMS AND METHODS FOR TESTING ELECTRONIC DEVICES

CROSS REFERENCE TO RELATED APPLICATIONS

This application claims the benefit of U.S. provisional patent application Ser. No. 61/291,826, filed Dec. 31, 2009 and U.S. provisional patent application Ser. No. 61/295,945, filed Jan. 18, 2010, The foregoing U.S. provisional patent applications bearing Ser. Nos. 61/291,826 and 61/295,945 are incorporated herein by reference in their entirety.

BACKGROUND

It is often desirable to test newly manufactured electronic devices to verify proper operation of the devices, determine operating capabilities of the devices, or the like. A contactor device comprising electrically conductive probes can be used to make temporary electrical connections with terminals of the devices, and test signals can be provided to and from the devices through the probes. Tests performed on the devices can include, for example, testing the functional operation of the devices, determining operating parameter (e.g., speed) ranges of the devices, stressing the device to simulate extended operation of the device, and the like. Such testing of electronic devices can add to the cost of producing such electronic devices. It can thus be advantageous to increase the efficiency of testing electronic devices by, among other things, simplifying testing, increasing testing automation and/or parallelism, and/or the like.

SUMMARY

In some embodiments, DUTs can be tested in a test system that includes an aligner and test cells. A DUT can be positioned and clamped in an aligned position on a carrier in the aligner. In the aligned position, electrically conductive terminals of the DUT can be in a predetermined position with respect to carrier alignment features of the carrier. While the DUT is clamped on the carrier in the aligned position, the carrier can be moved to a test cell, which can include a contactor with electrically conductive probes and contactor alignment features. The carrier alignment features of the carrier can be mechanically coupled with the contactor alignment features of the contactor, which can align the terminals of the DUT with the probes of the contactor. The DUT can then be tested in the test cell.

In some embodiments of the invention, a DUT test system can include an aligner, test cells, and a mover. The aligner can include a moving mechanism that can position a DUT on a carrier in an aligned position in which electrically conductive terminals of the DUT are in a predetermined position with respect to carrier alignment features of the carrier. Each test cell can include a contactor, which can have electrically conductive probes and contactor alignment features. Mechanically coupling the carrier alignment features of the carrier with the contactor alignment features of the contactor can align the terminals of the DUT with the probes of the contactor. The mover can include a robotic mechanism that can move the carrier with the DUT clamped in the aligned position from the aligner to one of the test cells.

BRIEF DESCRIPTION OF THE DRAWINGS

FIG. 3 illustrates an example aligner of the DUT test system of FIG. 1 according to some embodiments of the invention.

FIG. 6A illustrates a top view of an example of an aligner of the DUT test system of FIG. 1 that can align a DUT on a puck carrier according to some embodiments of the invention.

FIGS. 7A and 7B illustrate an example of loading a DUT on the puck carrier of FIGS. 5A-5C in the aligner of FIGS. 6A and 6B according to some embodiments of the invention.

FIG. 8B shows a cross-sectional, side view of the test cell of FIG. 8A.

FIG. 14 illustrates an example of a process for aligning a DUT to a carrier in an aligner of the DUT test system of FIG. 1 according to some embodiments of the invention.

FIG. 15 illustrates an example of a process for testing a DUT in a test cell of the DUT test system of FIG. 1 according to some embodiments of the invention.

FIG. 16 illustrates an example of a process for post-test processing of a DUT according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1:
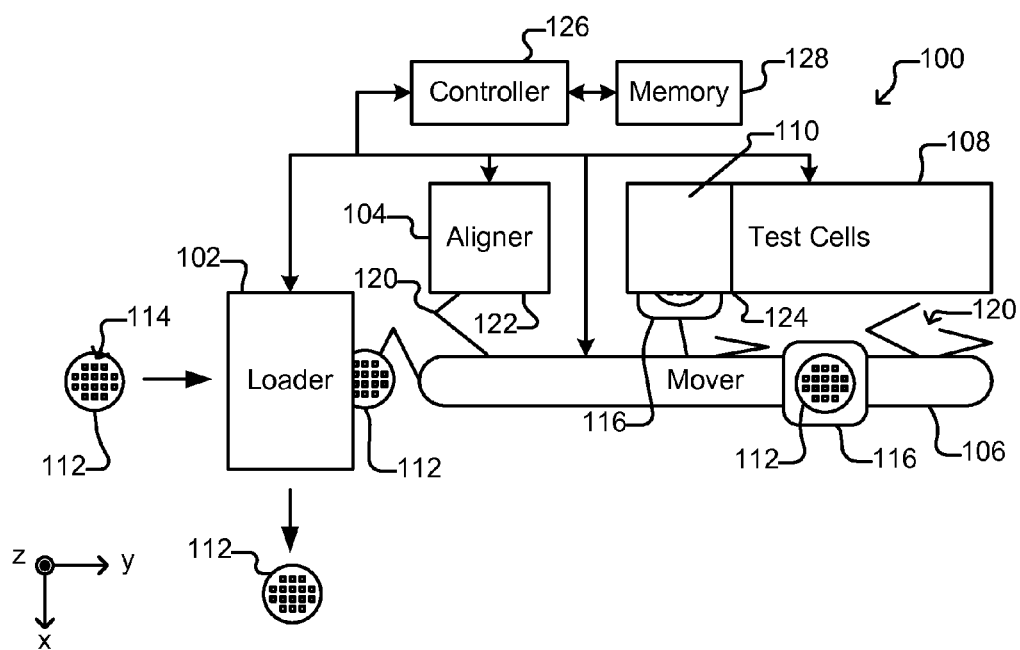
FIG. 1 illustrates an example of a DUT test system according to some embodiments of the invention.

FIG. 1 illustrates an example of a multi-DUT test system 100 for testing DUTs 112 in accordance with some embodiments of the invention. As shown, multi-DUT test system 100 can include a loader 102, an aligner 104, and a mover 106 as well as test cells 108. Test cell 110 can be an example of one of the test cells 108. Test cells 108 can thus comprise a plurality (e.g., two, three, four, five, ten, twenty, or more) test cells 110. Aligner 104 can include one or more access doors 122, and test cell 110 can include one or more access doors 124.

Figure 2A:
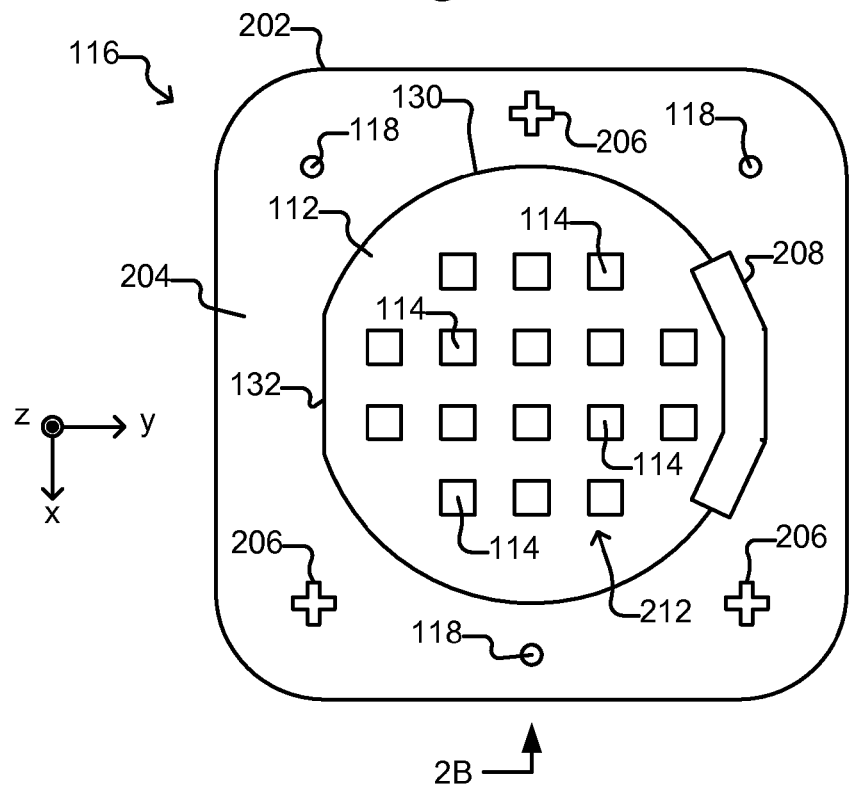
FIG. 2A shows a top view of a carrier and DUT that can be used in the DUT test system of FIG. 1 according to some embodiments of the invention.
Figure 2B:
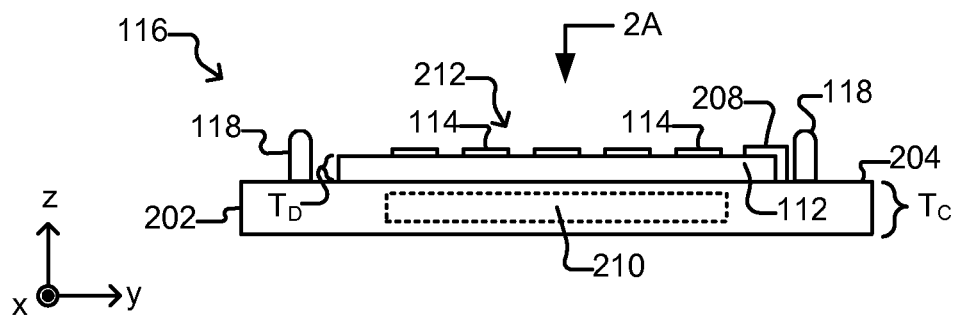
FIG. 2B shows a side view of the carrier and DUT of FIG. 2A.
Figure 4A:
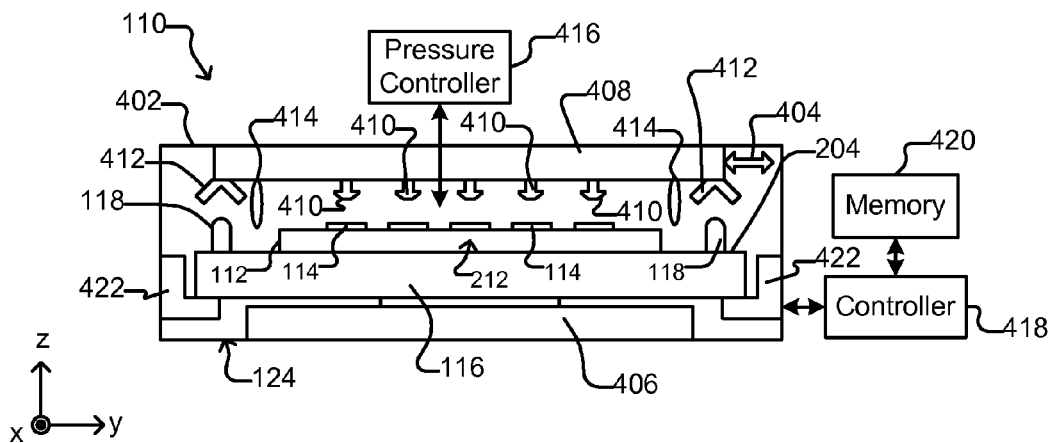
FIGS. 4A and 4B illustrate side views of an example test cell of the DUT test system of FIG. 1 according to some embodiments of the invention.
Figure 4B:
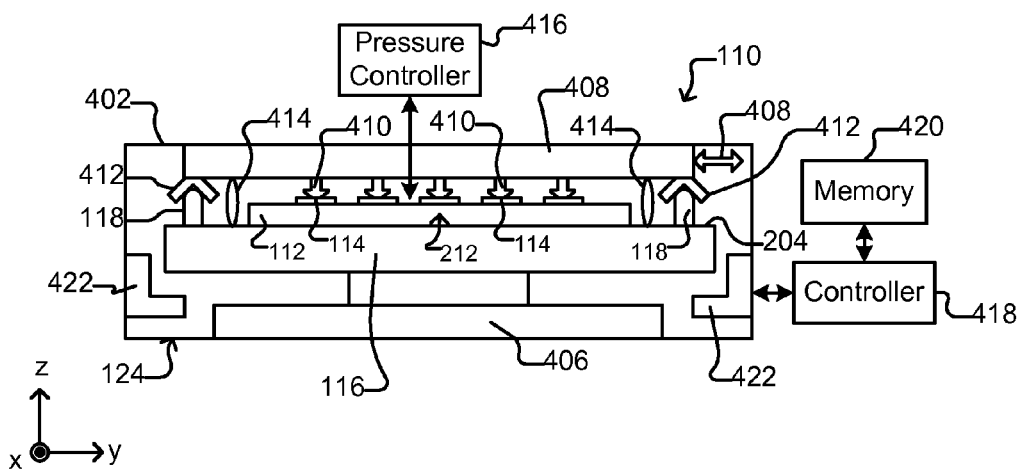

A DUT 112—which can be an acronym for device under test—can be loaded into loader 102 and placed on a carrier 116, an example of which is illustrated in FIGS. 2A and 2B. The position of DUT 112 on the carrier 116 can be adjusted in aligner 104 so that input and/or output terminals 114 of DUT 112 are aligned with respect to carrier alignment features 118 (see FIGS. 2A and 2B) on the carrier 116. DUT 112 aligned on carrier 116 can then be placed in a test cell 110, an example of which is illustrated in FIGS. 4A and 4B. Test cell 110 can include a contactor 408 with contactor alignment features 412 that are in predetermined positions with respect to electrically conductive probes 410. The carrier alignment features 118 on the carrier 116 can mechanically couple with the contactor alignment features 412 in test cell 110, which can cause the probes 410 of contactor 408 to align with terminals 114 of DUT 112 sufficiently for the probes 410 and terminals 114 to make physical contact and thereby establish electrical connections between the probes 410 and the terminals 114. Test signals can then be provided through contactor 408 to and from DUT 112 to test DUT 112. The tested DUT 112 can then be removed from test cell 110 and ultimately from multi-DUT test system 100, for example, through loader 102. Mover 106, which can include one or more robotic arms 120, can move DUTs 112 and DUT 112/carrier 116 combinations around multi-DUT test system 100. As shown, multi-DUT test system 100 can also include a controller 126 and memory 128.

DUT 112 can be one or more electronic devices comprising input and/or output electrical terminals 114. For example, DUT 112 can be a semiconductor wafer comprising unsingulated semiconductor dies. As another example, DUT 112 can comprise singulated dies (packaged or unpackaged) disposed on or in a holder. As yet another example, DUT 112 can be other types of electronic devices disposed on or in a holder. As shown in FIGS. 2A and 2B, DUT 112 can also include one or more DUT alignment features 212 that are in known positions with respect to terminals 114. In some embodiments, DUT alignment features 212 can comprise one or more of terminals 114. For example, DUT alignment features 212 can comprise one or more edges or corners of one or more terminals 114. In the examples illustrated in the figures, alignment features 212 correspond to one or more of the terminals 114 and there are thus not illustrated distinct alignment features 212. As noted, however, alignment features 212 can alternatively be separate marks, edges, corners, and/or structures (not shown) on DUT 112 and/or a DUT holder (not shown) in known offset positions from one or more of terminals 114. As shown, in some embodiments, DUT 112 can have an orientation mark 132. In some embodiments, orientation mark 132 can be an irregular portion of an edge 130 of DUT 112. As mentioned, DUT 112 can be a semiconductor wafer, and orientation mark 132 can be a clipped portion of the edge 130 of the wafer.

DUT 112 illustrated in FIGS. 2A and 2B is an example only, and DUT 112 can be different than shown. For example, DUT 112 can be other shapes. As another example, DUT 112 need not include all of the features shown (e.g., DUT 112 can lack alignment features 212 and/or orientation mark 132). As still another example, DUT 112 can have a different alignment mark 132 than shown, and can have more than one alignment mark 132. As yet another example, DUT 112 can have additional features not shown. As still another example, there can be more or fewer terminals 114 than shown.

Loader 102 can comprise equipment that can receive DUTs 112. For example, if DUT 112 is a semiconductor wafer comprising semiconductor dies, loader 102 can comprise equipment for receiving such a wafer. For example, loader 102 can comprise a robotic wafer handler such as is known in the field. As another example, loader 102 can comprise one or more EFEMs (equipment front end modules) such as are known in the field. Regardless, DUT 112 can be placed on carrier 116 in loader 102, and mover 106 can move the combination of DUT 112 and carrier 116 from loader 102 to aligner 104, where DUT 112 can be aligned to carrier 116. Alternatively, DUT 112 can be placed on and aligned to carrier 116 in aligner 104. In such a case, mover 106 can move a DUT 112 from loader 102 into aligner 104.

Mover 106 can comprise equipment that can move DUTs 112, carriers 116, and DUT 112/carrier 116 combinations around multi-DUT test system 100. For example, mover 106 can comprise one or more conveyers (not shown) and/or elevators (not shown) for moving DUTs 112, carriers 116, and DUT 112/carrier 116 combinations. As shown in FIG. 1, mover 106 can also include one or more robotic arms 120 each of which can grasp a DUT 112, a carrier 116, and/or a DUT 112/carrier 116 combination and move the DUT 112, the carrier 116, and/or the DUT 112/carrier 116 combination into or out of loader 102, aligner 104, and/or a test cell 110. Although not shown in the figures, DUT 112 and/or carrier 116 (including any embodiment of carrier 116 disclosed herein) can include handles (not shown) or other features that an arm 120 can grasp.

An example of a carrier 116 according to some embodiments of the invention is illustrated in FIGS. 2A and 2B. As shown, carrier 116 can comprise a substrate 202 (e.g., a block of material) with a carrying surface 204 on which a DUT 112 can be placed. Non-limiting examples of suitable carriers include a metal or ceramic plate or the like. In some embodiments, a thickness $T_C$ of substrate 202 can be greater than a thickness $T_D$ of DUT 112. For example, thickness $T_C$ can be two, five, eight, nine, ten, or more times the thickness $T_D$ of DUT 112. Alternatively, thickness $T_C$ can be equal to or less than thickness $T_D$.

A clamping mechanism 208 can selectively release DUT 112 so that DUT 112 can be moved about on carrying surface 204, and clamping mechanism 208 can selectively clamp DUT 112 in place on carrying surface 204. Thus, while clamping mechanism 208 is in a released state, DUT 112 is free to move (or be moved) on carrying surface 204, but while clamping mechanism 208 is in a clamped state, clamping mechanism 208 holds (or clamps) DUT 112 in placed on carrying surface 204 so that DUT 112 cannot move (or be moved) on carrying surface 204. Clamping mechanism 208 can be a mechanism suitable for selectively clamping and releasing DUT 112. Non-limiting examples of clamping mechanism 208 include one or more vacuum groves (not shown) in the carrying surface 204, electro-static mechanisms (e.g., clamps) (not shown), mechanical clamps (not shown), or the like.

Carrier 116 can comprise carrier alignment features 118, which as will be seen, can couple (e.g., mechanically) with corresponding contactor alignment features 412 (see FIGS. 4A and 4B) in a test cell 110. While carrier alignment features 118 and contactor alignment features 412 are coupled, carrier 116 is in a predetermined orientation with respect to probes 410 of a contactor 408 in a test cell 110. DUT 112 can thus be positioned on carrying surface 204 such that terminals 114 of the DUT 112 align with—and thus contact and make electrical connections with—the probes 410 of the contactor 408 when the DUT 112/carrier 116 combination is placed in a test cell 110. As used herein, DUT 112 is "aligned to," "aligned on," or in "an aligned position" on carrier 116 when DUT 112 is positioned on a carrier 116 with terminals 114 positioned with respect to carrier alignment features (e.g., carrier alignment features 118) such that the terminals 114 of DUT 112 and probes 410 of contactor 408 are sufficiently aligned to make contact and thereby establish electrical connections between terminals and probes 410 while carrier alignment features (e.g., 118) of the carrier 116 are mechanically coupled with contactor alignment features 412 of contactor 408 (e.g., as shown in FIG. 4B).

Carrier alignment features 118 can be mechanical features such as extensions that fit into and thus couple with corresponding contactor alignment features 412, which can be mechanical receptacles. Alternatively, contactor alignment features 412 can be extensions that fit into and thus couple with corresponding carrier alignment features 118, which can be receptacles. Regardless, the number and placement of carrier alignment features 118 shown in FIGS. 2A and 2B is an example only, and there can be more or fewer than three carrier alignment features 118, which can be in different locations and/or a different pattern than shown in FIGS. 2A and 2B. In some embodiments, the number and placement of carrier alignment features 118 can be such as to kinematically align the carrier 116 and contactor 408 in six degrees of freedom or, alternatively, in three degrees of freedom in a plane that is generally parallel with the terminals 114 of a DUT 112. As used herein, kinematically aligned means aligned using the minimum number of alignment feature pairs (each pair being one carrier alignment feature 118 and one contactor alignment feature 412). For example, three alignment feature pairs in a two-dimensional plane, and six alignment feature pairs in three-dimensional space.

DUT 112 can be aligned directly to the carrier alignment features 118. In some embodiments, however, carrier 116 can include offset alignment features 206 that are located in known positions with respect to the carrier alignment features 118, and DUT 112 can be aligned directly to the offset alignment features 206 and thus indirectly to the carrier alignment features 118. Offset alignment features 206 can be optimized for alignment. For example, offset alignment features 206 can be features that are readily identified in a captured image of carrying surface 204. Thus, in some embodiments, offset alignment features 206 can comprise shapes, colors, patterns, or the like that are readily identified in a digitized image of carrying surface 204 and DUT 112.

As shown in FIG. 2B, carrier 116 can include one or more temperature control devices 210. Temperature control device 210 can selectively bring DUT 112 to and/or maintain DUT 112 at a desired temperature in a range of possible temperatures. Temperature control device 210 can, for example, comprise one or more heating devices and/or cooling devices. For example, temperature control device 210 can comprise one or more resistive heating elements (not shown), passages (not shown) in or on substrate 202 through which a heated or cooled fluid (e.g., liquid, gas, or the like) can be circulated. In some embodiments, temperature control device 210 can be self contained on carrier 116. That is, temperature control device 210 can operate at least for a period of time without connecting to equipment that is not on or part of carrier 116 and/or DUT 112. In other embodiments, temperature control device 210 is not self contained on carrier 116 but connects to equipment (e.g., an electric power supply, a source of heated or cooled fluid, or the like) (not shown) that is not on or part of carrier 116 and/or DUT 112. In some embodiments, the material and/or structure of substrate 202 can be selected to facilitate heating or cooling DUT 112.

Carrier 116 as shown in FIGS. 2A and 2B is an example only. Thus, for example, carrier 116 need not include all of the features or elements illustrated in FIGS. 2A and 2B; carrier 116 can have additional features or elements not shown in FIGS. 2A and 2B; and carrier 116 can have different features or elements than shown in FIGS. 2A and 2B. For example, as generally discussed above, carrier 116 need not include offset alignment features 206. As another example, carrier 116 need not include temperature control device 210. As yet another example, carrier 116 can include a cover (not shown) and sealing mechanism (not shown) that can provide a self-contained, clean-room environment around DUT 112. As still another example, one or more of the following devices or features can be included in some embodiments of carrier 116: electrical, pneumatic, hydraulic, and/or vacuum connectors or the like; and/or one or more sensors, electronic controllers, electronic memory devices, and/or other electronic circuitry.

An example of an aligner 104 according to some embodiments of the invention is illustrated in FIG. 3. As shown, aligner 104 can include a housing 302, which can include an access door 122 through which DUT 112, a carrier 116, and/or a combination of a DUT 112 and carrier 116 can be placed into aligner 104. In some embodiments, housing 302 can be sufficiently sealed or sealable to provide a self-contained, clean room enclosure when access door 122 is closed. Aligner 104 can also include or be connected to a controller 308 and memory 316. Controller 308 can control all or part of operation of aligner 104 and can operate in accordance with program code (as defined below) stored in memory 316. Alternatively or in addition, controller 308 can operate in whole or in part in accordance with hardwired circuitry. Controller 308 can be one or more of any of the types of controllers identified below with respect to controller 126, and memory 316 can be one or more of any of the types of memory devices identified below with respect to memory 128.

As mentioned above, DUT 112 can be placed on carrier 116 in loader 102 or aligner 104. Carrier 116 can be disposed on any holding mechanism or structure (not shown) in aligner 104. For example, carrier 116 can be disposed on a bottom portion of housing 302 as shown in FIG. 3, a stage (not shown), or the like.

Aligner 104 can include a mechanism 318 for guiding carrier 116 into a particular position and/or orientation in aligner 104. For example, guide mechanism 318 can comprise guide rails, depressions, stop structures, and/or the like that guide carrier 116 into at least a generally rough position or orientation in aligner 104. In some embodiments, for example, guide mechanism can comprise guide rails (not shown) and stop structures (not shown). Such guide rails (not shown) can guide carrier 116 as carrier is being loaded into housing 302 and stop structures (not shown) can stop movement of carrier 116 along the guide rails (not shown) when carrier 116 is in a desired position and/or orientation in housing 302.

As shown in FIG. 3, aligner 104 can include a moving mechanism 306 that can be activated to move DUT 112 relative to carrier 116. For example, moving mechanism 306 can move DUT 112 without moving carrier 116; move carrier 116 without moving DUT 112; and/or independently move DUT 112 and carrier 116. Clamping mechanism 208 on carrier 116 can release DUT 112 so that moving mechanism 306 can move DUT 112 on the carrying surface 204 of substrate 202. Non-limiting examples of moving mechanism 306 include one or more motor driven stages, piezo stages, piezo walking beam stages, or the like. Other examples of moving mechanism 306 include equipment for selectively directing air jets at parts of the DUT 112 to move the DUT 112 with respect to the carrier 116, equipment for selectively creating electrostatic charges that move DUT 112 with respect to carrier 116, and the like.

Aligner 104 can also include one or more cameras 304, which can capture one or more electronic (e.g., digital) images of DUT 112 and/or carrier 116. Those images can be used to move DUT 112 into an aligned position on carrier 116. A human user (not shown) can manually control moving mechanism 306 to move DUT 112 relative to carrier 116 until DUT 112 is in an aligned position on carrier 116. Alternatively or in addition, a controller 308 can receive images of DUT 112 and/or carrier 116 and can control mover 306 to move DUT relative to carrier 116 (as discussed above) to move DUT 112 into an aligned position on carrier 116. Moving DUT 112 into an aligned position on carrier 116 can involve more than one sequence of capturing images of DUT 112 and/or carrier 116, and then moving DUT 112 on carrier 116. Regardless of how moving mechanism 306 is activated to move DUT 112 on carrier 116, once DUT 112 is in an aligned position on carrier 116, clamping mechanism 208 can clamp DUT 112 in the aligned position on carrying surface 204.

As shown in FIG. 3, in some embodiments, aligner 104 can include a camera mount 310 with camera alignment features 312 that can couple (e.g., mechanically) with carrier alignment features 118 or other alignment features (not shown) of carrier 116. Cameras 304 can be mounted on camera mount 310 in known (e.g., calibrated) positions with respect to camera alignment features 312 so that cameras 304 are in known (or calibrated) positions with respect to carrier alignment features 118 while camera alignment features 312 and carrier alignment features 118 are coupled as shown in FIG. 3. In such a case, cameras 304 can capture an image of one or more of DUT alignment features 212, and such images can be used (e.g., by controller 308) to move DUT into an aligned position on carrier 116. Cameras 304 need not capture an image of carrier alignment features 118 or any other feature or element of carrier 116. For example, controller 308 (and/or a human operator) can utilize the captured images of DUT alignment features 212 and the known positions of cameras 304 with respect to carrier alignment features 118 to move DUT 112 relative to carrier 116 into an aligned position on carrier 116. A moving mechanism 314 can move camera mount 310 into and out of coupling with carrier alignment features 118. For example, camera mount 310 is shown in dashed lines in FIG. 3 in a position in which camera mount 310 (specifically camera alignment features 312) is decoupled from carrier alignment features 118, and camera mount 310 coupled with carrier alignment features 118 is shown in FIG. 3 in solid lines. Alternatively, carrier 116 (and thus DUT 112) can be moved or camera mount 310 and carrier 116 can be moved to couple carrier alignment features 118 and camera alignment features 312.

In other embodiments, aligner 104 need not include features (e.g., camera alignment features 312) that couple cameras 304 to carrier alignment features 118. For example, cameras 304 can be mounted to housing 302 or other structures (not shown) in housing 302. In such a case, the positions of cameras 304 may not be known with respect to carrier alignment features 118, and cameras 304 can capture images of both DUT alignment features 212 (e.g., ones of terminals 114) and carrier alignment features 118, and those images can be used by controller 308 (and/or a human operator) to move DUT 112 into an aligned position on carrier 116. As another example, cameras 304 can be in known positions with respect to alignment features (not shown but can be like camera alignment features 312) of a clamp (not shown) or similar device that is in housing 302 but not directly coupled to cameras 304. Those alignment features (not shown) can couple with carrier alignment features 118 and thereby move carrier 116 into a position in which carrier alignment features 118 are in known positions with respect to cameras 304.

Cameras 304 can be any camera or other device for capturing images (e.g., digital images) of DUT 112 and/or carrier 116. Although not shown, mechanisms for moving cameras 304 can be included in aligner 104. For example, cameras 304 can be moveable on camera mount 310.

Camera alignment features 312 can be mechanical features such as extensions that fit into and thus couple with corresponding carrier alignment features 118 which can be mechanical receptacles. Alternatively, camera alignment features 312 can be receptacles into which corresponding carrier alignment features 118 (which can be extensions) fit. Regardless, the number and placement of camera alignment features 312 shown in FIG. 3 is an example, and there can be more or fewer than shown. Moreover, camera alignment features 312 can be in different locations and/or a different pattern than shown in FIG. 3. In some embodiments, the number and placement of camera alignment features 312 can be such as to kinematically align carrier 116 and camera mount 310 (and thus cameras 304) in six degrees of freedom in three-dimensional space, or alternatively, in three degrees of freedom in a plane that is generally parallel with the terminals 114 of DUT 112.

Aligner 104 as shown in FIG. 3 is an example only. Thus, for example, aligner 104 need not include all of the features or elements illustrated in FIG. 3; aligner 104 can have additional features or elements not shown in FIG. 3; and aligner 104 can have different features or elements than shown in FIG. 3. For example, as generally discussed above, aligner 104 need not include camera alignment features 312, camera mount 310, or moving mechanism 314 (e.g., cameras 304 can be mounted to housing 302 or another structure or structures (not shown) in housing 302). As another example, as also generally discussed above, there can be a mechanical coupling mechanism (not shown) in housing 302 that mechanically couples with carrier alignment features 118 and thereby moves carrier 116 into a predetermined position with respect to cameras 304. As yet another example, there can be only one camera 304 or there can be more than the two cameras 304 shown in FIG. 3.

As discussed above, test cells 108 illustrated in FIG. 1 can comprise two or more test cells of which test cell 110 can be an example. An example test cell 110 according to some embodiments of the invention is illustrated in FIGS. 4A and 4B.

As shown, test cell 110 can include a housing 402, which can include an access door 124 through which a DUT 112/carrier 116 combination can be placed into test cell 110. In some embodiments, housing 402 can be sufficiently sealed to provide a self-contained, clean room enclosure when access door 124 is closed. Test cell 110 can also include or be connected to a controller 418 and memory 420. Controller 418 can control all or part of operation of test cell 110 and can operate in accordance with program code (as defined below) stored in memory 420. Alternatively or in addition, controller 418 can operate in whole or in part in accordance with hard-wired circuitry. Controller 418 can be one or more of any of the types of controllers identified below with respect to controller 126, and memory 420 can be one or more of any of the types of memory devices identified below with respect to memory 128.

As also shown, test cell 110 can include a contactor 408, which can comprise electrically conductive probes 410. Probes 410 can be any structure suitable for contacting terminals 114 of DUT 112 and thereby making electrical connections with the terminals 114. Examples of suitable probes 410 include spring probes, studs, bumps, and the like. Contactor 408 can connect electrically to electrical connections 404 through which power and ground, control and test signals, and the like can be provided to contactor 408, which can include electrical connections (not shown) to probes 410. Power, ground, control and test signals, and the like can thus be provided through contactor 408 to DUT 112. Similarly, signals from DUT 112 can be provided through contactor 408 to electrical connections 404.

Contactor 408 can be any electronic device suitable for providing electrical connections to and from probes 410. For example, contactor 408 can comprise a probe card assembly, a probe head assembly, a membrane contactor, a load board, or the like. In some embodiments, contactor 408 can comprise a combination of one or more circuit boards, stiffeners, probe heads, interposers, and/or the like.

As mentioned, test cell 110 can also include contactor alignment features 412, which can be coupled to contactor 408, housing 402, or other elements of test cell 110. As also discussed above, contactor alignment features 412 can mechanically couple with corresponding carrier alignment features 118 on carrier 116 so that probes 410 align with terminals 114 sufficiently for probes 410 to contact and make electrical connections with terminals 114. Contactor 408 can thus be mounted in (or to) housing 402 in a position with respect to contactor alignment features 412 that aligns probes 410 with terminals 114 when carrier alignment features 118 on carrier 116 are coupled with contactor alignment features 412 on contactor 116.

Test cell 110 can include a guide mechanism 422 for guiding carrier 116 into a particular position and/or orientation in test cell 110. For example, guide mechanism 422 can comprise guide rails, depressions, stop structures, and/or the like that guide carrier 116 into at least a generally rough position or orientation in test cell 110. In some embodiments, for example, guide mechanism 422 can comprise guide rails (not shown) and stop structures (not shown). Such guide rails (not shown) can guide carrier 116 as carrier is being loaded into housing 402 and stop structures (not shown) can stop movement of carrier 116 along the guide rails (not shown) when carrier 116 is in a desired position and/or orientation in housing 402. The desired position can be a rough but nevertheless sufficient alignment of carrier alignment features 118 with contactor alignment features 412 for carrier alignment features 118 to mechanically couple with contactor alignment features 412 as lift 406 (discussed below) moves carrier 116 as illustrated in FIG. 4B.

As also shown in FIGS. 4A and 4B, test cell 110 can include a lift 406. As shown in FIG. 4A, the DUT 112/carrier 116 combination can be placed on lift 406, and as shown in FIG. 4B, lift 406 can move the DUT 112/carrier 116 combination such that carrier alignment features 118 mechanically couple with contactor alignment features 412 and terminals 114 contact probes 410. As shown in FIGS. 4A and 4B, lift 406 can be moveable in the "z" direction. In some embodiments, lift 406 can also be moveable in the "x,y" plane and can also rotate about one or more of the "x," "y," and/or "z" axes. Although the invention is not so limited, in the examples illustrated in the figures, the "z" direction or axis is generally perpendicular to the carrying surface 204 of carrier 116, and the "x" and "y" directions or axes (and thus the "x,y" plane) are generally parallel with the carrying surface 304 of carrier 116. Lift 406 can be any mechanism suitable for supporting and moving carrier 116. For example, lift 406 can be a moveable stage. Examples of suitable lifts include a pneumatic, motor, or hydraulic driven stage.

Test cell 110 can include or be connected to a pressure controller 416 that can regulate air pressure. For example, pressure controller 416 can selectively reduce and/or increase air pressure to a desired level. As shown, one or more air-tight seals 414 can be disposed between contactor 408 and DUT 112. Seals 414 can create an air-tight seal between contactor 408 and DUT 112, and pressure controller 416 can selectively set the air pressure between contactor 408 and DUT 112 to a desired level. Pressure controller 416 can thus selectively create a vacuum in the space between contactor 408 and DUT 112, which can, for example, draw contactor 408 and DUT 112 together. Pressure controller 416 can also selectively increase air pressure in the space between contactor 408 and DUT 112, which can, for example, tend to push contactor 408 and DUT 112 apart. Pressure controller 416 can thus selectively regulate (e.g., increase or decrease) a force (e.g., the total aggregate force) of the probes 410 against the terminals 114 of DUT 112, which can regulate the total force (pressure) between terminals 114 of DUT 112 and contactor 408. For example, pressure controller 416 can cause the total force between terminals 114 of DUT and contactor 408 to be a selected amount including zero.

In some embodiments, lift 406 can move carrier 116 so that terminals 114 are in proximity to or in initial contact with probes 410. Pressure controller 416 can then create a vacuum in the space between contactor 408 and DUT 112 to draw contactor 408 and DUT 112 together with sufficient force to create electrical connections between terminals 114 and probes 410.

Test cell 110 as shown in FIGS. 4A and 4B is an example only. Thus, for example, test cell 110 need not include all of the features or elements illustrated in FIGS. 4A and 4B; test cell 110 can have additional features or elements not shown in FIGS. 4A and 4B; and test cell 110 can have different features or elements than shown in FIGS. 4A and 4B. For example, test cell 110 can include one or more power supplies, control and test signal generators (analog and/or digital), temperature control devices, or the like (not shown). Such power supplies and signal generators (not shown) can be connected to contactor 408 through electrical connections 404 or, alternatively, can be part of contactor 408 and can be connected to probes 410 through contactor 408. As another example, test cell 110 can include features (not shown) that allow contactor 408 to be removed and replaced with a different contactor. As yet another example, test cell 110 need not include seals 414 or pressure controller 416. As still another example, test cell 110 can include guide mechanisms (not shown) that facilitate loading a DUT 112/carrier 116 combination into test cell 110 and removing DUT 112/carrier 116 combination from test cell 110. Moreover, such guide mechanisms (not shown) can guide the DUT 112/carrier 116 combination into a position that is sufficiently aligned with contactor 408 that lift 406 can move the DUT carrier 112/carrier 116 combination such that carrier alignment features 118 and contactor alignment features 412 couple without the use of cameras or other such mechanisms. For example, such guide mechanisms can include guide rails, depressions, stop structures, and/or the like (not shown).

Controller 126 can control operation of part or all of multi-DUT test system 100. For example, controller 126 can be communicatively connected to loader 102, aligner 104, test cells 108, and/or mover 106. Controller 126 can receive status signals from and/or send control signals to one or more of loader 102, aligner 104, test cells 108, and/or mover 106.

Controller 126 can comprise one or more processors (e.g., a microprocessor or a microcontroller), computers, or the like, which can operate in accordance with program code stored in digital memory 128, which can comprise any digital memory device or devices including without limitation a semiconductor memory device, a magnetic memory device, an optical memory device, or the like. Alternatively or in addition, controller 126 can comprise hardwired circuitry, and controller 126 can operate in whole or in part in accordance with such hardwired circuitry. As used herein, "program code" refers to machine readable instructions that can be stored in memory 128 and executed by controller 126. Non-limiting examples of program code include software, microcode, firmware, scripts, or the like.

In FIGS. 1-4B, controller 126 is shown controlling all of the elements of DUT test system 110, and aligner 104 and each test cell 110 are shown as including or being connected to controllers 308 and 418, respectively. The foregoing configuration is an example only, and variations are contemplated. For example, controller 126 can perform all or part of the functions and control performed by controller 308 and/or controller 418. As another example, additional controllers can be included that separately control, for example, loader 102 and/or mover 106.

A general description of multi-DUT test system 100 along with examples of a DUT 112, loader 102, aligner 104, mover 106, and test cell 110 are illustrated in FIGS. 1-4B and discussed above. As noted throughout the above discussion, the examples illustrated in FIGS. 1-4B and discussed above are examples and are not intended to be limiting. Indeed, many variations are possible some of which have been noted in particular with respect to carrier 116, aligner 104, and test cell 110. Many other variations of multi-DUT test system 100 are also possible. For example, there can be more than one loader 102, aligner 104, and/or mover 106. As another example, loader 102 and aligner 104 need not be separate elements. That is, for example, aligner 104 can be part of loader 102. As another example, loader 102 need not be included in multi-DUT test system 100, and DUTs 112 can be loaded into and taken out of system 100 through aligner 104. As yet another example of a variation of test system 100, test cells 108 can be disposed in multiple locations (e.g., around mover 106). As still another example, additional elements can be included in multi-DUT test system 100 such as storage apparatuses (not shown) that can, for example, store DUTs 112 (tested or untested), carriers 116, and the like.

FIGS. 5A-12B illustrate additional examples of embodiments of carrier 116 and embodiments of aligners 104 and test cells 110 for those carriers 116 according to some embodiments of the invention. FIGS. 13-15 illustrate examples of processes for testing DUTs 112 in multi-DUT test system 100 according to some embodiments of the invention.

Figure 5A:
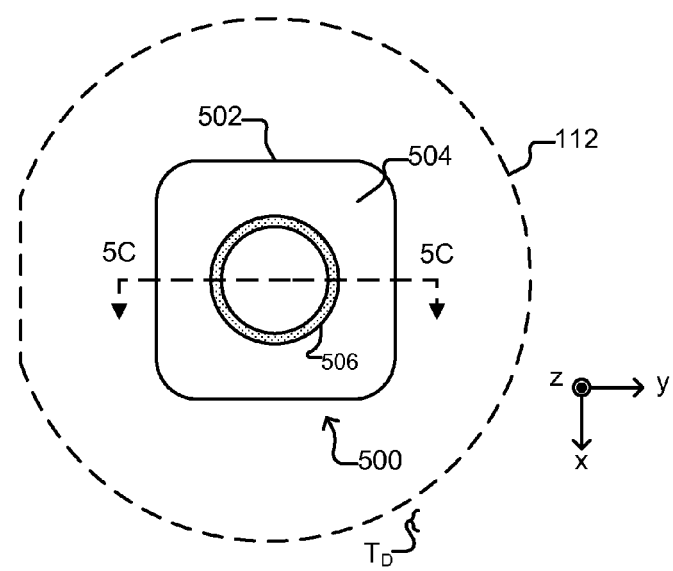
FIG. 5A illustrates a top view of a puck carrier that can be an example of a carrier of the DUT test system of FIG. 1 according to some embodiments of the invention.
Figure 5B:
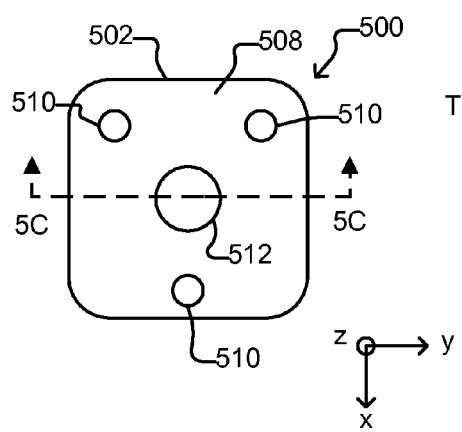
FIG. 5B shows a bottom view of the puck carrier of FIG. 5A.
Figure 5C:
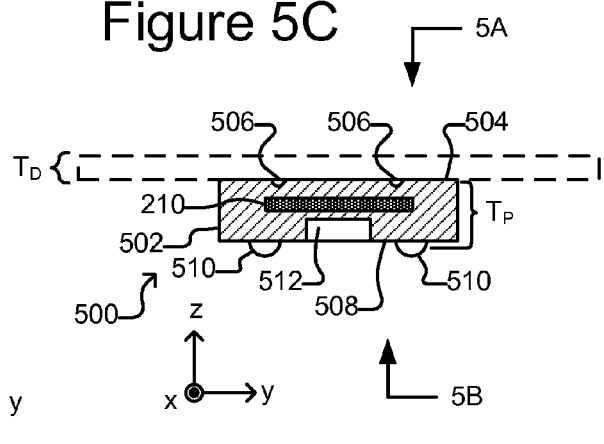
FIG. 5C shows a cross-sectional, side view of the puck carrier of FIG. 5A.

FIGS. 5A-5C illustrate an example of an embodiment of carrier 116 in the form of a puck carrier 500. FIGS. 6A-7B illustrate an embodiment of aligner 104 configured for puck carrier 500, and FIG. 8A-9B illustrate an embodiment of test cell 110 configured for puck carrier 500.

As mentioned, puck carrier 500 of FIGS. 5A-5C is an example of carrier 116 according to some embodiments of the invention. Puck carrier 500 can thus replace carrier 116 in any of FIGS. 1-4B and in the discussion above of those figures. Moreover, puck carrier 500 can include features or variations discussed herein with respect to carrier 116 even though not specifically mentioned with respect to puck carrier 500.

As shown, puck carrier 500 can comprise a puck 502 with a carrying surface 504 on which DUT 112 (shown in dashed lines in FIGS. 5A and 5C) can be placed. Puck 502 can comprise a substrate (e.g., a block of material) or the like. For example, puck 502 can comprise a metal plate, a ceramic, plate, or the like. In some embodiments, a thickness $T_P$ of puck 502 can be greater than a thickness $T_D$ of DUT 112. For example, thickness $T_P$ can be two, five, eight, nine, ten, or more times the thickness $T_D$ of DUT 112. Alternatively, thickness $T_P$ can be equal to or less than thickness $T_D$.

One or more vacuum grooves 506 can be provided in carrying surface 504. Mechanisms (not shown) and other equipment (not shown) can be provided selectively to create, hold, and release a vacuum in vacuum grooves 504. Such mechanisms (not shown) can include one or more connection nozzles (not shown) and passages from the nozzles (not shown) to the vacuum grooves 504. A vacuum in grooves 506 can clamp DUT 112 in place on carrying surface 504, and release of the vacuum can release DUT 112 so that DUT 112 can moved on carrying surface 504. Vacuum grooves 504 and associated mechanisms for creating and releasing a vacuum can thus be an example of clamping mechanism 208 of FIGS. 2A and 2B. Puck 502 can alternatively include a different type of clamping mechanism such as mechanical clamps or the like. The number, shape, and/or pattern of vacuum grooves 504 shown in FIGS. 5A and 5C is an example only and can be different than shown.

As can be seen in FIGS. 5A and 5C, carrying surface 504 can be smaller than DUT 112 such that DUT 112 extends beyond carrying surface 504. In some embodiments, the area of carry surface 504 can be three-fourths or less, two-thirds or less, one-half or less, one-third or less, one-fourth or less of the area of DUT 112. In some embodiments, the area of carrying surface 504 can be one-twenty-fifth or less, one-fiftieth or less, or one-seventy-fifth or less of the area of DUT 112. That the area of carrying surface 504 is smaller than a corresponding area of the DUT 112 can allow the puck carrier 500 to have a smaller size and/or thermal mass as compared to a carrier 116 that is larger. That puck carrier 500 can thus be smaller can provide advantages in some embodiments, such as reduced manufacturing cost and reduced thermal mass. Regardless of the relative size of carrying surface 504, puck 502 can have a thickness $T_P$, which as will be discussed, can be approximately equal to a depth D of cavities 606 and 806 in chuck 602 in aligner 104 and chuck 802 in a test cell 110.

Puck alignment features 510 can be disposed on an opposite surface 508 of puck 502. For example, puck alignment features 510 can be extensions that extend from opposite surface 508 or receptacles that extend into opposite surface 508. As will be seen, puck alignment features 510 can correspond to cavity alignment features 610 in a chuck 602 in the configuration of aligner 104 illustrated in FIGS. 6A-7B and cavity alignment features 810 in a similar chuck 802 in the configuration of a test cell 110 illustrated in FIGS. 8A-9B. Puck alignment features 510 can be mechanical features such as extensions or receptacles that fit into and thus couple with the corresponding cavity alignment features 610 and 810, which can be mechanical receptacles or extensions.

The number and placement of puck alignment features 510 shown in FIGS. 5B and 5C is an example only, and there can be more or fewer than three puck alignment features 510, which can be in different locations and/or a different pattern than shown in FIGS. 5B and 5C. In some embodiments, the number and placement of puck alignment features 510 can be such as to kinematically align puck carrier 500 on chuck 602 in the aligner 104 illustrated in FIGS. 6A-7B and chuck 802 in the test cell 110 illustrated in FIGS. 8A-9B in six degrees of freedom in three-dimensional space or, alternatively, in three degrees of freedom in a plane that is generally parallel with carrying surface 504 of puck 502.

As illustrated in FIGS. 5B and 5C, a lift coupling mechanism 512 can be disposed on or into opposite surface 508 of puck 502. As will be seen, lift coupling mechanism 512 can couple with a lift 618 in the aligner 104 illustrated in FIGS. 6A-7B and a puck lift 818 in the test cell 110 illustrated in FIGS. 8A-9B. The lift coupling mechanism 512 and the lift 618 can have similar interlocking irregular shapes that orient the puck 502 in a particular orientation.

Puck carrier 500 as shown in FIGS. 5A-5C is an example only. Thus, for example, puck carrier 500 need not include all of the features or elements illustrated in FIGS. 5A-5C; puck carrier 500 can have additional features or elements not shown in FIGS. 5A-5C; and puck carrier 500 can have different features or elements than shown in FIGS. 5A-5C. For example, as shown in FIG. 5C, puck carrier 500 can include one or more temperature control devices 210 (which are described above). Alternatively, puck carrier 500 does not include temperature control device 210. As another example, puck carrier 500 can include a cover and sealing mechanism (not shown) that can provide a self-contained, clean-room environment around DUT 112. As still another example, DUT 112 can be clamped to the carrying surface 504 of puck 502 by other types of clamping mechanisms such as, for example, a mechanical clamp or the like. Vacuum grooves 506 can thus be replaced with another type of clamping mechanism.

Figure 6B:
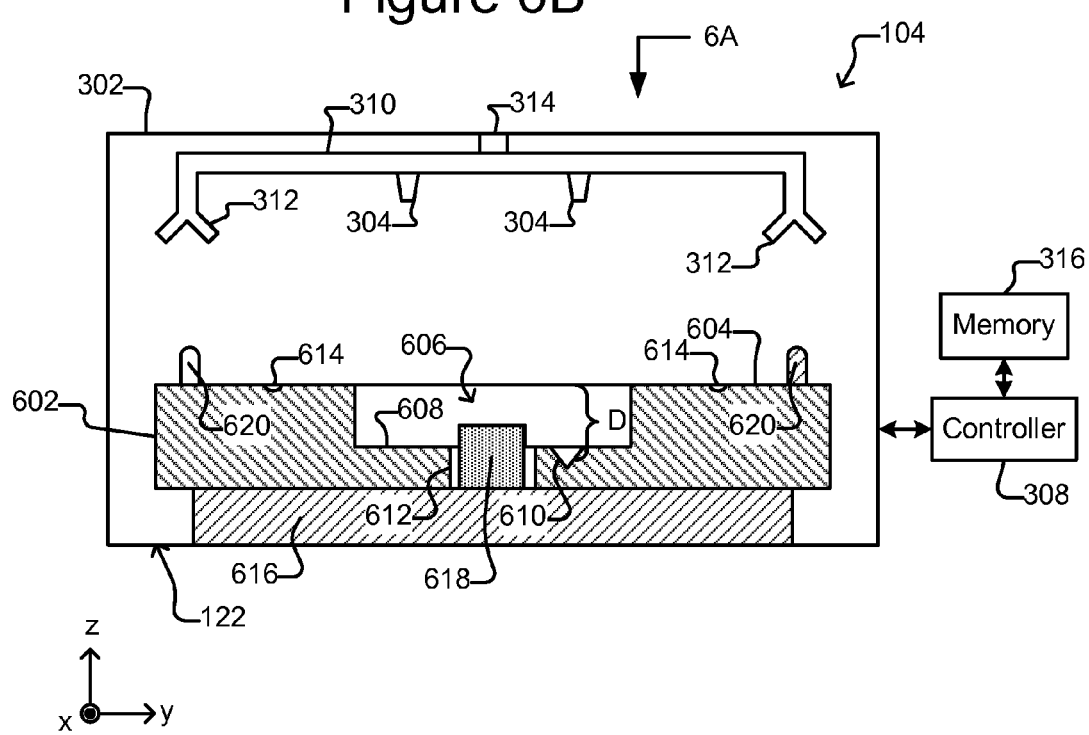
FIG. 6B shows a cross-sectional, side view of the aligner of FIG. 6A.

FIGS. 6A-6B illustrate an example of a configuration of aligner 104 that can be used to align DUT 112 on puck carrier 500 according to some embodiments of the invention. Cutout 600 in FIG. 6A shows part of the inside of aligner 104. As shown, aligner 104 of FIGS. 6A and 6B can include a housing 302 with access door 122 as generally discussed above with respect to FIG. 3. Aligner 104 can also include one or more cameras 304, camera mount 310 with camera alignment features 312, and a moving mechanism 314 for moving camera mount 310 as also generally discussed above with respect to FIG. 3. Aligner 104 of FIGS. 6A and 6B can also include a controller 408 and memory 316 also as discussed above with respect to FIG. 3. Different than FIG. 3, however, the embodiment of aligner 104 illustrated in FIGS. 6A and 6B can include a stage 616, a lift 618, and a moveable chuck 602, which can be examples of moving mechanism 306 in FIG. 3.

As shown in FIGS. 6A and 6B, chuck 602 can have an upper surface 604, and there can be a cavity 606 in upper surface 604 in which puck carrier 500 can be placed. A lower surface 608 of cavity 606 can have cavity alignment features 610, which as discussed above, can correspond to puck alignment features 510 of puck 502. Cavity 606 can have a depth D that is approximately equal to thickness $T_P$ of puck 502 so that, as generally illustrated in FIG. 7B, upper surface 604 of chuck 602 and carrying surface 504 of puck 502 are substantially (i.e., approximately) coplanar while puck alignment features 510 are coupled with cavity alignment features 610. Upper surface 604 and carrying surface 504 are substantially coplanar if DUT 112, while disposed on both upper surface 604 and carrying surface 504, is not damaged or broken while being aligned in aligner 104. Alternatively, one or more of the carrying surface 504 of puck 502, the upper surface 604 of chuck 602, the lower surface 608 in cavity 606, the cavity alignment features 610, and/or the puck alignment features 510 can be sufficiently compliant (e.g., flexible) in the "z" direction in the figures to allow movement of the upper surface 604 and/or the carrying surface 504 so that the upper surface 604 and carrying surface 504 are substantially coplanar.

As also shown in FIGS. 6A and 6B, there can be one or more vacuum grooves 614 in upper surface 604 of chuck 602. Mechanisms (not shown) and other equipment (not shown) can be provided selectively to create, hold, and release a vacuum in vacuum grooves 614. Such mechanisms (not shown) can include one or more connection nozzles (not shown) and passages from the nozzles (not shown) to the vacuum grooves 614. A vacuum in grooves 614 can clamp DUT 112 in place on upper surface 604, and release of the vacuum can release DUT 112 so that DUT 112 can moved on or away from upper surface 604. The number, shape, and pattern of vacuum grooves 614 shown in FIGS. 6A and 6B is an example only and can be different than shown.

As also illustrated in FIGS. 6A and 6B, chuck 602 can have chuck alignment features 620, which can couple with camera alignment features 312 of camera mount 310. Chuck alignment features 620 can be structurally and functionally the same as or similar to carrier alignment features 118 as carrier alignment features 118 are described above with respect to camera alignment features 312 in FIG. 3. For example, chuck alignment features 620 can be positioned on chuck 602 with respect to cavity alignment features 610 such that chuck alignment features 620 are in known positions with respect to puck 502 while puck alignment features 510 are coupled with cavity alignment features 610. Then, while camera alignment features 312 are coupled with chuck alignment features 620, cameras 304 are in known positions with respect to puck 502, whose position and orientation can be defined by puck alignment features 510 and cavity alignment features 610.

Lift 618 can be a moving mechanism that can move a puck 502 into and out of cavity 606. As noted, lift coupling mechanism 512 in puck 502 and the lift 618 can have similar interlocking irregular shapes that orient the puck 502 in a particular orientation. Chuck 602, which can be a moveable stage, can be moveable, for example, in the "x,y" plane and rotatable about the "z" axis. Stage 616 can include driving mechanisms (not shown) for activating and/or controlling lift 618 and chuck 602.

FIGS. 7A and 7B illustrate the aligner 104 of FIGS. 6A and 6B with a DUT 112/puck carrier 500 combination in the aligner 104. As shown, puck 502 can be disposed on lift 618 (e.g., lift 618 can be coupled with lift coupling mechanism 512 as shown), and lift 618 can move puck 502 into (FIG. 7B) and out of (FIG. 7A) cavity 606 in chuck 602. Although not shown, guide mechanisms (e.g., like guide mechanism 318) can be provided for placing puck 502 in aligner 104 in an initial rough orientation so that, for example, puck alignment features 510 are roughly but sufficiently aligned with cavity alignment features 610 to couple as lift 618 moves puck 502 into cavity 606. For example, as generally noted above, the lift coupling mechanism 512 and the lift 618 can have similar interlocking irregular shapes that orient the puck 502 so that the puck 502—and thus puck alignment features 510—are positioned in a rough initial orientation when puck 502 is coupled to life 618. Lift coupling mechanisms 512 and lift 618 can thus be an example of guide mechanism 318 of FIG. 3.

Moving mechanism 314 can move camera mount 310 such that camera alignment features 312 are moved into (FIG. 7B) and out of (FIG. 7A) coupling with chuck alignment features 620. As noted above, while puck alignment features 510 and cavity alignment features 610 are coupled and camera alignment features 312 and chuck alignment features 620 are coupled (as shown in FIG. 7B), cameras 304 and puck alignment features 510 are in known positions with respect to each other.

As noted above, aligner 104 need not include features (e.g., camera alignment features 312) that couple cameras 304 to carrier alignment features 118. For example, cameras 304 can be mounted to housing 302 or other structures (not shown) in housing 302. In such a case, the positions of cameras 304 may not be known with respect to carrier alignment features 118, and cameras 304 can capture images of both DUT alignment features 212 (e.g., ones of terminals 114) and carrier alignment features 118, and those images can be used by controller 308 (and/or a human operator) to move DUT 112 into an aligned position on carrier 116.

As noted above, DUT 112 can be clamped to and unclamped from carrying surface 504 of puck 502 by creating or releasing a vacuum in vacuum groves 506. DUT 112 can similarly be clamped to and unclamped from the upper surface 604 of chuck 602 by creating or releasing a vacuum in vacuum grooves 614. While clamped to the upper surface 604 of chuck 602 and released from the carrying surface 504 of puck 502, chuck 602 can move DUT 112 with respect to puck 502 to position DUT alignment features 212 with respect to puck alignment features 510, which can be the equivalent of carrier alignment features 118 of FIGS. 2A and 2B. Chuck can thus move DUT 112 into an aligned position on puck carrier 500.

The configuration of aligner 104 shown in FIGS. 6A-7B is an example only. Thus, for example, aligner 104 need not include all of the features or elements illustrated in FIGS. 6A-7B; aligner 104 can have additional features or elements not shown in FIGS. 6A-7B; and aligner 104 can have different features or elements than shown in FIGS. 6A-7B. For example, as generally discussed above with respect to FIG. 3, aligner 104 need not include camera alignment features 312, camera mount 310, or moving mechanism 314 (e.g., cameras 304 can be mounted to housing 302 or another structure or structures (not shown) in housing 302). In such a case, chuck 602 need not include chuck alignment features 620. As another example, although two cameras 304 are shown, there can alternatively be only one camera 304 or more than two cameras 304. As yet another example, puck 502 without DUT 112 can be initially disposed in cavity 606 (e.g., with puck alignment features 510 coupled to cavity alignment features 610), and DUT 112 can thereafter by inserted into aligner 104 and placed on the carrying surface 504 of puck 502 and the upper surface 604 of chuck 602. As still another example, DUT 112 can be clamped to the upper surface 604 of chuck 602 by other types of clamping mechanisms such as, for example, a mechanical clamp, an electro-static clamp, or the like. Vacuum grooves 614 can thus be replaced with another type of clamping mechanism. As another example, moveable lifts 1102 and/or stage 1104 can be replaced with other types of moving mechanisms for moving DUT 112 with respect to membrane carrier 1000. For example, a motor driven stage or chuck or the like can replace moveable lifts 1102 and/or stage 1104. As another example, equipment for selectively directing air jets at parts of the DUT 112 to move the DUT 112 on carrying surface 1004 of membrane carrier 1000 can replace lifts 1102 and/or stage 1104. As yet another example, equipment for selectively creating electrostatic charges that move DUT 112 on carrying surface 1004 can replace lifts 1102 and/or stage 1104. All of the foregoing examples of replacements for lifts 1102 and/or stage 1104 can be examples of moving mechanism 306 of FIG. 3.

Figure 8A:
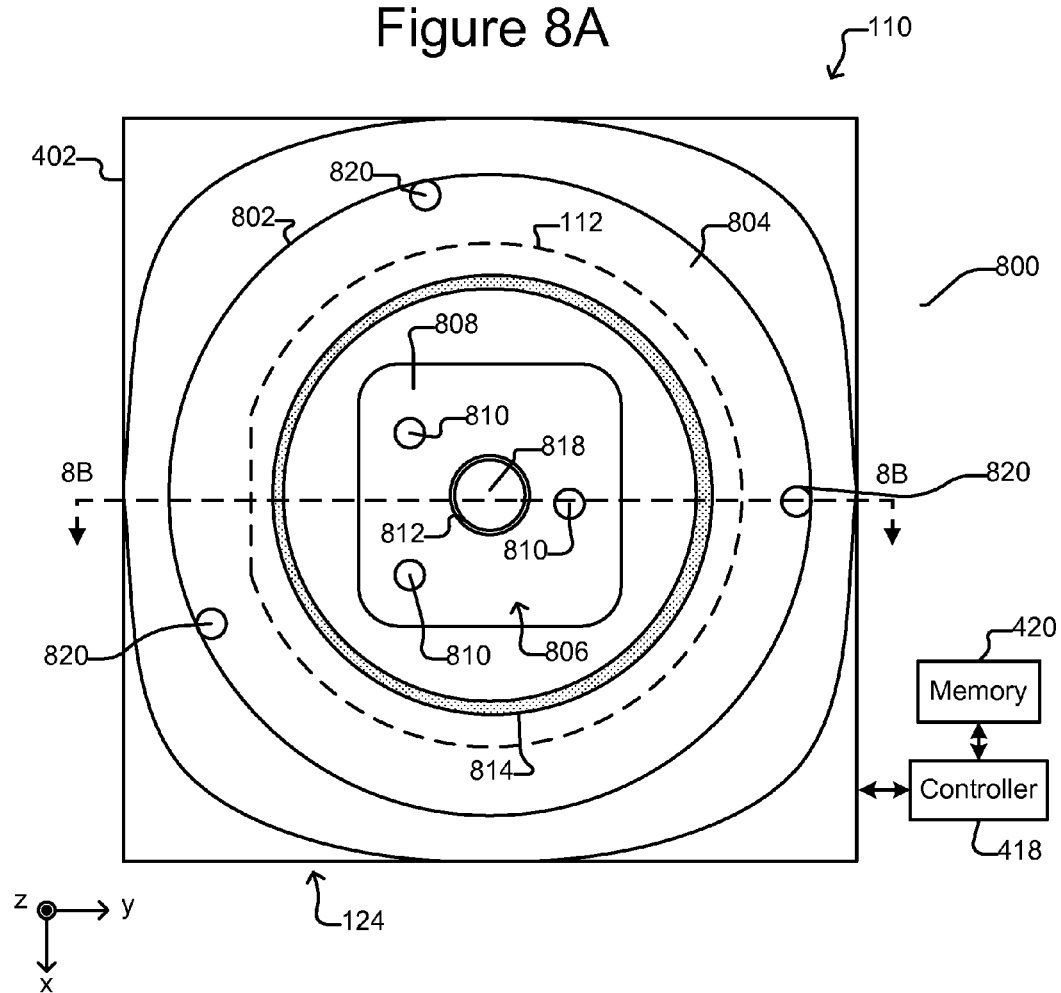
FIG. 8A illustrates a top view of an example of a test cell of the DUT test system of FIG. 1 that can test a DUT on a puck carrier according to some embodiments of the invention.

FIGS. 8A and 8B illustrate an example of a configuration of test cell 110 that can be used to test a DUT 112/puck carrier 500 combination according to some embodiments of the invention. Cutout 800 in FIG. 8A shows part of the inside of test cell 110. As shown, test cell 110 of FIGS. 8A and 8B can include a housing 402 with access door 124 as generally discussed above with respect to FIGS. 4A and 4B. Test cell 110 can also include electrical connections 404, a contactor 408 with probes 410, contactor alignment features 412, seals 414, and a pressure controller device 416 as also generally discussed above with respect to FIGS. 4A and 4B. Test cell 110 of FIGS. 8A and 8B can also include a controller 418 and memory 420 also as discussed above with respect to FIGS. 4A and 4B. Different than FIGS. 4A and 4B, however, the embodiment of test cell 110 illustrated in FIGS. 8A and 8B can include a chuck 802, a chuck lift 816, and a puck lift 818, which can be examples of lift 406 in FIGS. 4A and 4B.

Chuck 802 can be similar to chuck 602 and can have similar elements and features. For example, as shown, chuck 802 can have an upper surface 804, and there can be a cavity 806 in upper surface 804 in which puck carrier 500 can be placed. A lower surface 808 of cavity 806 can have cavity alignment features 810, which can correspond to and couple with puck alignment features 510 of puck 502. Cavity 806 can have a depth D that is approximately equal to thickness $T_P$ of puck 502 so that, as generally illustrated in FIG. 9B, upper surface 804 of chuck 802 and carrying surface 504 of puck 502 are substantially (i.e., approximately) coplanar while puck alignment features 510 are coupled with cavity alignment features 810. Upper surface 804 and carrying surface 504 are substantially coplanar if DUT 112, while disposed on both upper surface 804 and carrying surface 504, is not damaged or broken while being contacted by probes 410.

As also shown in FIGS. 8A and 8B, there can be one or more vacuum grooves 814 in upper surface 804 of chuck 802. Mechanisms (not shown) and other equipment (not shown) can be provided selectively to create, hold, and release a vacuum in vacuum grooves 814. Such mechanisms (not shown) can include one or more connection nozzles (not shown) and passages from the nozzles (not shown) to the vacuum grooves 814. A vacuum in grooves 814 can clamp DUT 112 in place on upper surface 804, and release of the vacuum can unclamp DUT 112 from upper surface 804. The number, shape, and pattern of vacuum grooves 814 shown in FIGS. 8A and 8B is an example only and can be different than shown.

As also illustrated in FIGS. 8A and 8B, chuck 802 can have chuck alignment features 820, which can couple with contactor alignment features 412. Chuck alignment features 820 can be structurally and functionally the same as or similar to carrier alignment features 118 as described above with respect to FIGS. 4A and 4B. For example, chuck alignment features 820 can be positioned on chuck 802 with respect to cavity alignment features 810 such that chuck alignment features 820 are in known positions with respect to puck 502 while puck alignment features 510 are coupled with cavity alignment features 810. As noted above, probes 410 can be in known positions with respect to contactor alignment features 412 and cavity alignment features 810; and DUT alignment marks 212—and thus terminals 114 of DUT 112—were aligned in aligner 104 to corresponding known positions with respect to puck alignment features 510. Thus, while contactor alignment features 412 are coupled with chuck alignment features 820 and puck alignment features 510 are coupled with cavity alignment features 810, probes 410 align with terminals 114.

Lift 818 can be a moving mechanism that can move a puck 502 into and out of cavity 806. Chuck lift 816 can move chuck 802—and thus chuck alignment features 802—into and out of coupling with contactor alignment features 412.

Figure 9A:
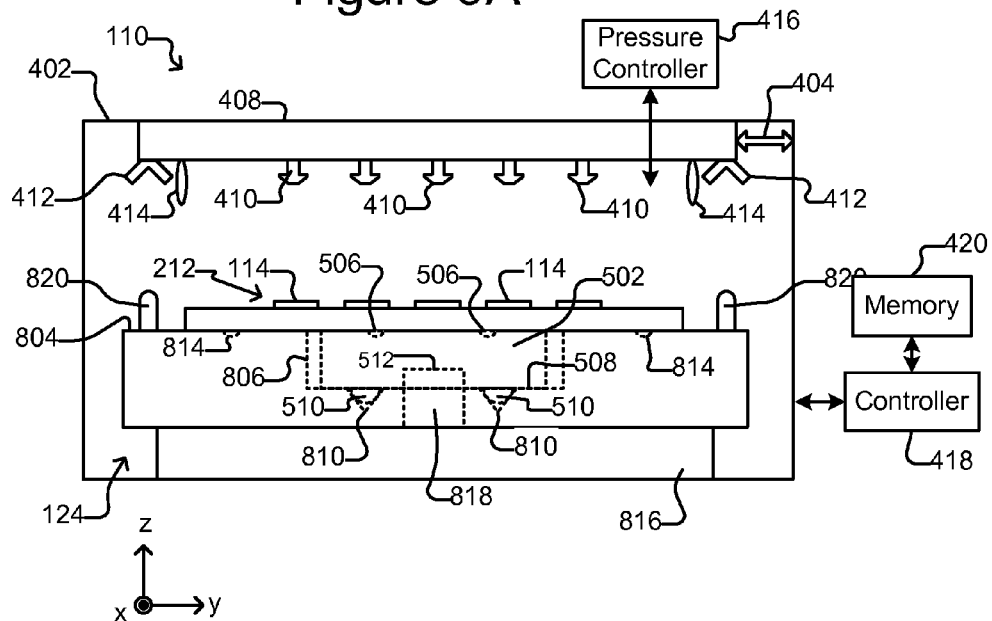
FIGS. 9A and 9B illustrate an example of loading a DUT on the puck carrier of FIGS. 5A-5C into the test cell of FIGS. 8A and 8B according to some embodiments of the invention.
Figure 9B:
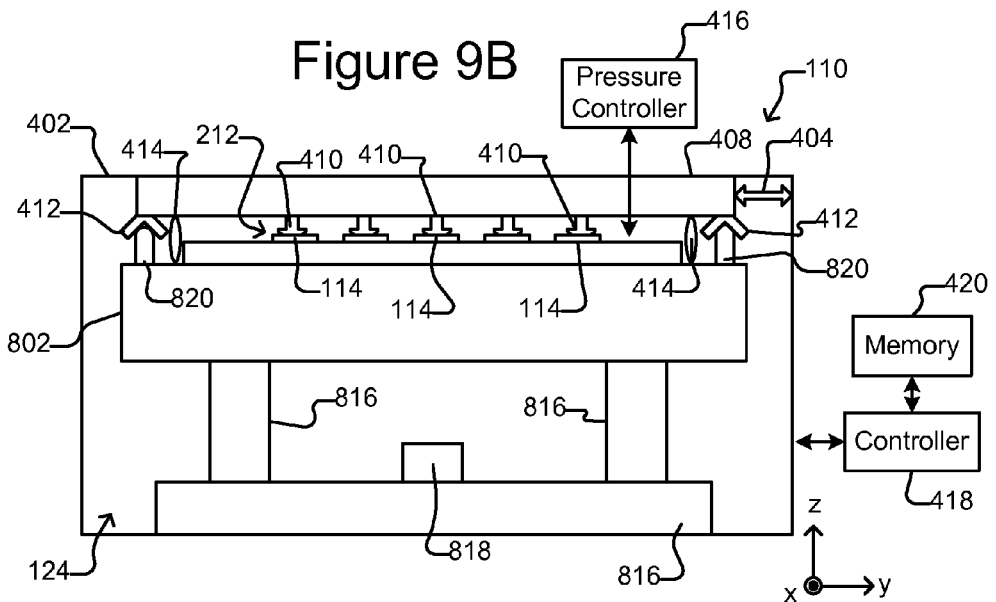

FIGS. 9A and 9B illustrate the test cell 110 illustrated in FIGS. 8A and 8B with a DUT 112/puck carrier 500 combination in the test cell 110. Lift 818 can be like lift 618 as described above. That is, puck 502 can be disposed on lift 818 (e.g., lift 818 can be coupled with lift coupling mechanism 512 as shown), and lift 818 can move puck 502 into (similar to FIG. 7B) and out of (similar to FIG. 7A) cavity 806 in chuck 802. Although not shown, guide mechanisms (e.g., like guide mechanism 422) can be provided for placing puck 502 in test cell 110 in an initial rough orientation so that, for example, puck alignment features 510 are roughly but sufficiently aligned with cavity alignment features 810 to couple as lift 818 moves puck 502 into cavity 806. For example, the lift coupling mechanism 512 and the lift 818 can have similar interlocking irregular shapes that orient the puck 502 so that the puck 502—and thus puck alignment features 510—are positioned in a rough initial orientation when puck 502 is coupled to lift 818. Lift coupling mechanisms 512 and lift 818 can thus be an example of guide mechanism 422 of FIG. 4. Other examples of such guide mechanisms (not shown) can include guide rails (not shown) or the like.

Chuck lift 816 can move chuck 802 such that chuck alignment features 820 are moved out of coupling with contactor alignment features 412 as shown in FIG. 9A. Chuck lift 816 can also move chuck 802 such that chuck alignment features 820 are moved into coupling with contactor alignment features 412 as shown in FIG. 9B. As discussed above, pressure controller 416 can increase or decrease the air pressure between contactor 408 and DUT 112.

As noted above, DUT 112 can be clamped to and unclamped from carrying surface 504 of puck 502 by creating or releasing a vacuum in vacuum groves 506. DUT 112 can similarly be clamped to and unclamped from the upper surface 804 of chuck 802 by creating or releasing a vacuum in vacuum grooves 814.

The configuration of a test cell 110 illustrated in FIGS. 8A-9B is an example only. Thus, for example, test cell 110 need not include all of the features or elements illustrated in FIGS. 8A-9B; test cell 110 can have additional features or elements not shown in FIGS. 8A-9B; and test cell 110 can have different features or elements than shown in FIGS. 8A-9B. For example, DUT 112 can be clamped to the upper surface 804 of chuck 802 by other types of clamping mechanisms such as, for example, a mechanical clamp or the like. Vacuum grooves 814 can thus be replaced with another type of clamping mechanism. As another example, test cell 110 need not include pressure controller 416 or seals 414.

Figure 10A:
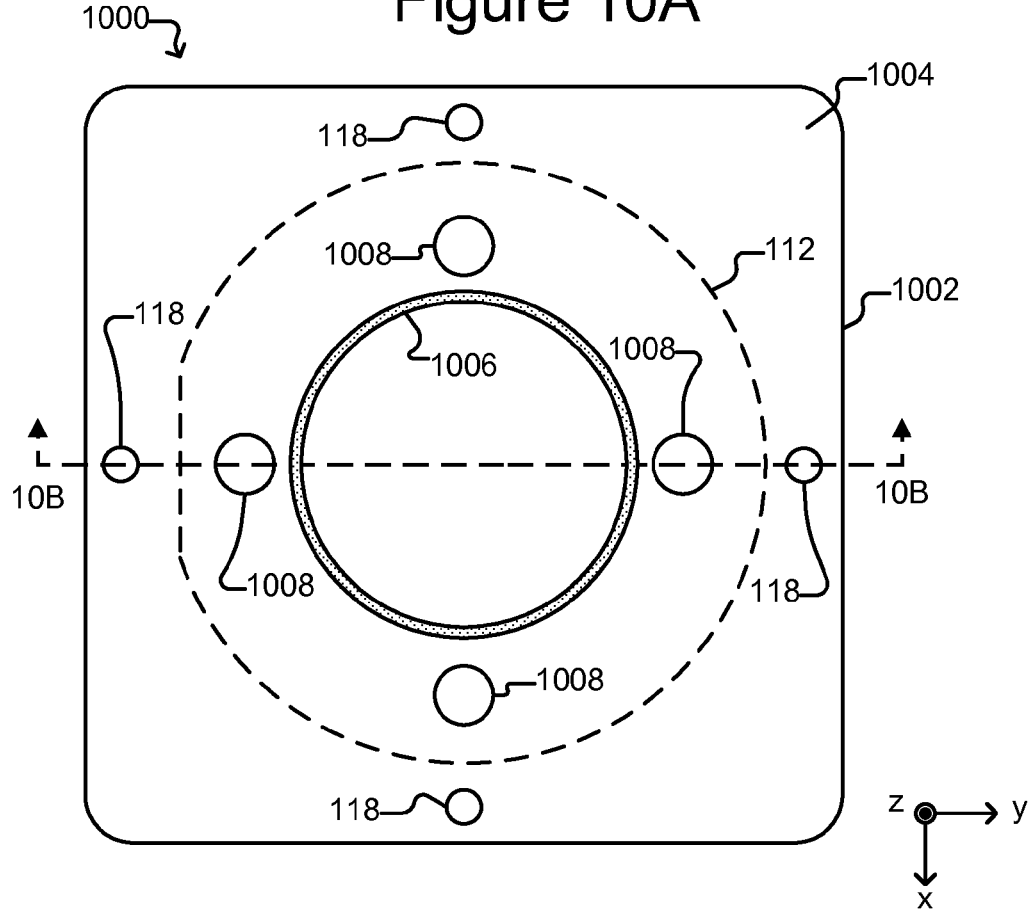
FIG. 10A is a top view of a membrane carrier that can be an example of a carrier of the DUT test system of FIG. 1 according to some embodiments of the invention.
Figure 10B:
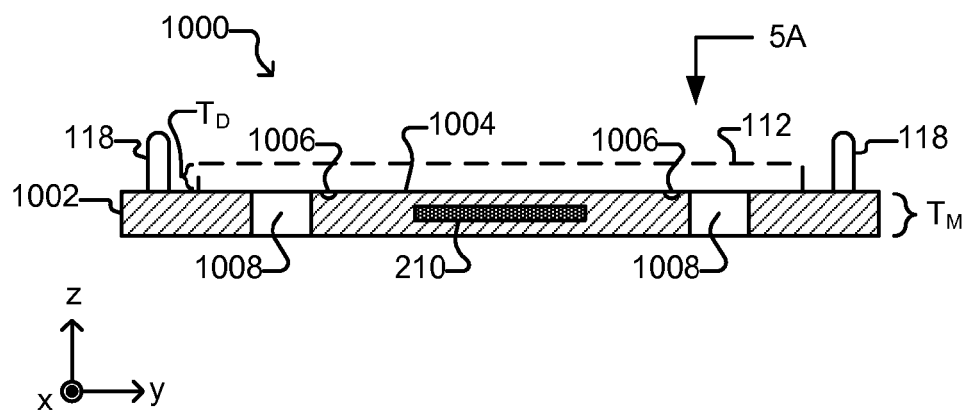
FIG. 10B is a cross-sectional, side views of the membrane carrier of FIG. 10A.

FIGS. 10A and 10B illustrate an example of an embodiment of carrier 116 in the form of a membrane carrier 1000.

Figure 11A:
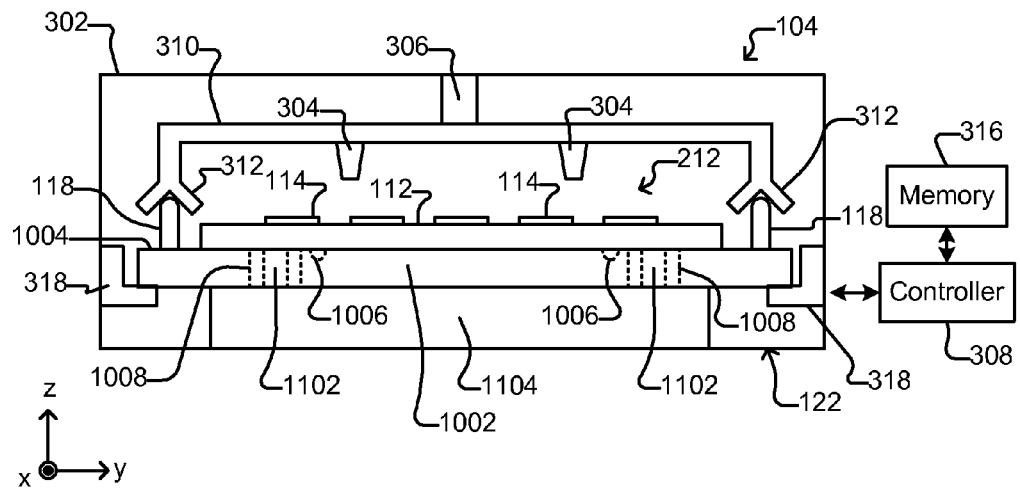
FIGS. 11A and 11B show side views of an example of an aligner of the DUT test system of FIG. 1 that can align a DUT on a membrane carrier according to some embodiments of the invention.
Figure 11B:
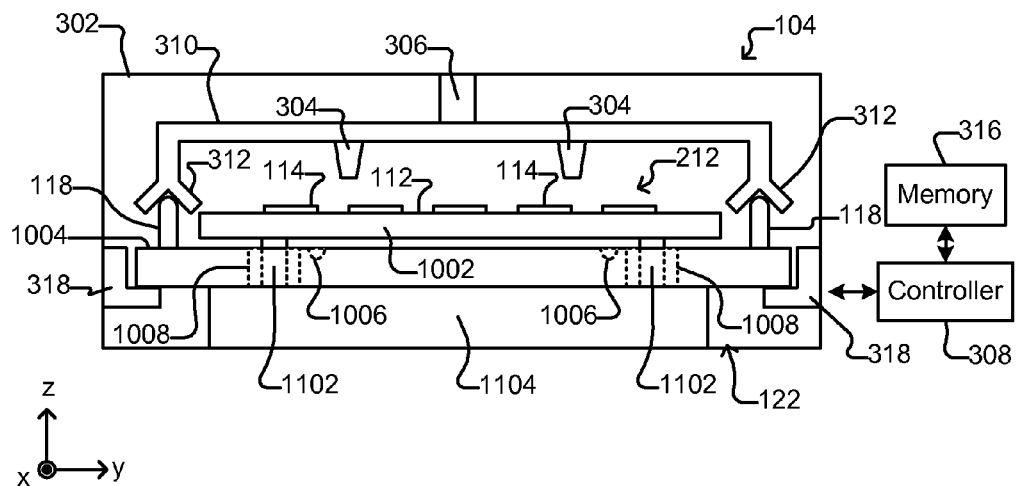
Figure 12A:
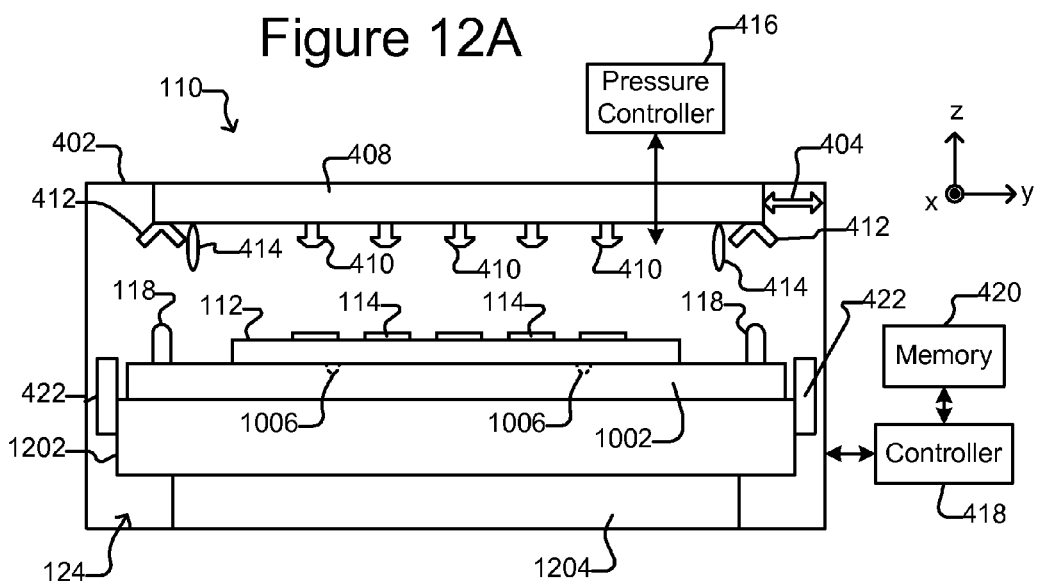
FIGS. 12A and 12B show side views of an example of a test cell of the DUT test system of FIG. 1 that can test a DUT on a membrane carrier according to some embodiments of the invention.
Figure 12B:
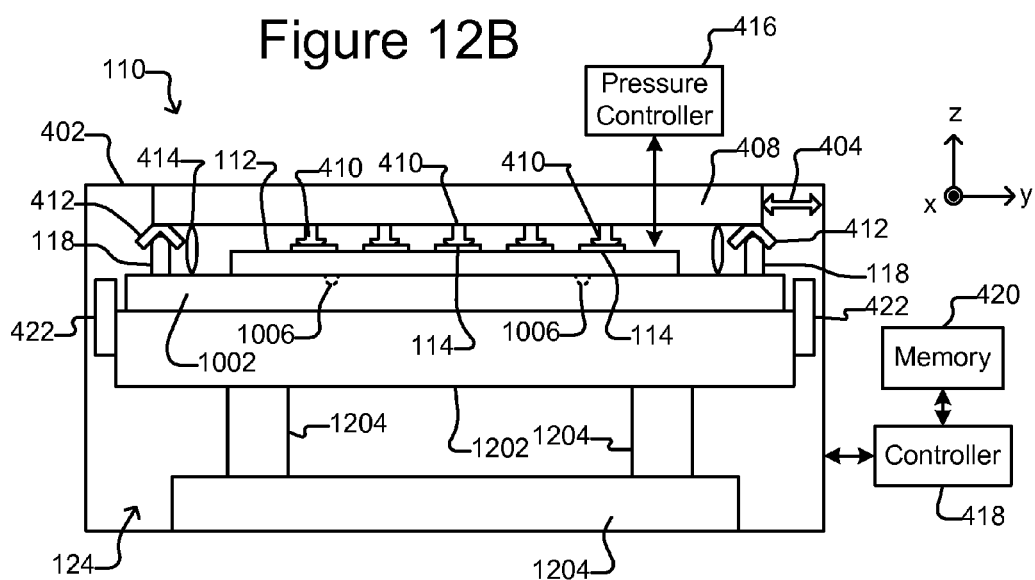
Figure 13:
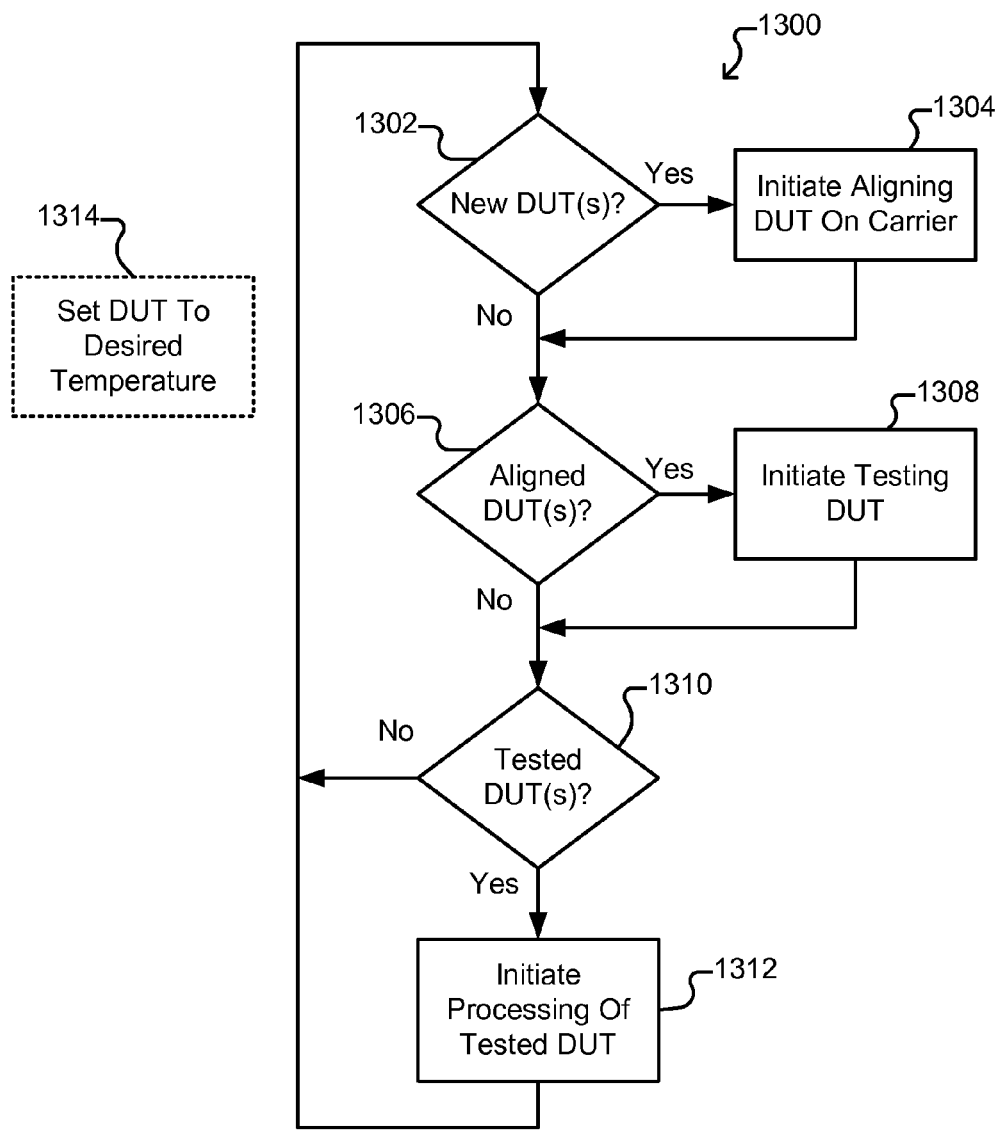
FIG. 13 illustrates an example of a process for testing DUTs in the DUT test system of FIG. 1 according to some embodiments of the invention.

FIGS. 11A and 11B illustrate an embodiment of aligner 104 configured for membrane carrier 1000, and FIGS. 12A and 12B illustrate an embodiment of test cell 110 configured for membrane carrier 1000.

As mentioned, membrane carrier 1000 of FIGS. 10A and 10B is an example of carrier 116 according to some embodiments of the invention. Membrane carrier 1000 can thus replace carrier 116 in any of FIGS. 1-4B and in the discussion above of those figures. Moreover, membrane carrier 1000 can include features or variations discussed herein with respect to carrier 116 even though not specifically mentioned with respect to membrane carrier 1000.

As shown, membrane carrier 1000 can comprise a membrane substrate 1002 with a carrying surface 1004 on which DUT 112 (shown in dashed lines in FIGS. 10A and 10B) can be placed. Membrane substrate 1002 can comprise a substrate (e.g., a block of material) or the like. For example, membrane substrate 1002 can comprise a metal plate, or ceramic plate, or the like. In some embodiments, a thickness $T_M$ of membrane substrate 1002 can be equal to or less than a thickness $T_D$ of DUT 112. For example, thickness $T_M$ can be ninety percent, eighty percent, seventy percent, sixty percent, fifty percent, forty percent, or less than the thickness $T_D$ of DUT 112. Alternatively, thickness $T_M$ can be a different percentage of thickness $T_D$, or thickness $T_M$ can be equal to or greater than $T_D$. That the thickness $T_M$ of membrane substrate 1002 can be relatively small can allow the membrane carrier 500 to have a smaller size and/or thermal mass as compared to a carrier 116 that is larger. That membrane carrier 1000 can thus be smaller can provide advantages in some embodiments, such as reduced manufacturing cost and reduced thermal mass.

One or more vacuum grooves 1006 can be provided in carrying surface 1004. Mechanisms (not shown) and other equipment (not shown) can be provided selectively to create, hold, and release a vacuum in vacuum grooves 1004. Such mechanisms (not shown) can include one or more connection nozzles (not shown) and passages from the nozzles (not shown) to the vacuum grooves 1006. A vacuum in grooves 1006 can clamp DUT 112 in place on carrying surface 1004, and release of the vacuum can release DUT 112 so that DUT 112 can be moved on carrying surface 1004. Vacuum grooves 1006 and associated mechanisms for creating and releasing a vacuum can thus be an example of clamping mechanism 208 of FIGS. 2A and 2B. Membrane substrate 1002 can alternatively include a different type of clamping mechanism such as mechanical clamps or the like. The number, shape, and pattern of vacuum grooves 1006 shown in FIGS. 10A and 10B is an example only and can be different than shown.

As shown, the carrying surface 1004 of membrane substrate 1002 can be greater than the size of DUT 112. As also shown, membrane substrate 1002 can include carrier alignment features 118 such as are discussed above. The alignment features 118 can be disposed outside of the area on the carrying surface 1004 on which DUT 112 can be disposed. Membrane substrate 1002 can also include lift holes 1008, which can be disposed in membrane substrate 1002 within the area on the carrying surface 1004 on which DUT 112 can be disposed. As will be seen, lift holes 1008 can allow moveable lifts 1102 (see FIGS. 11A and 11B) to pass through membrane substrate 1002 and lift DUT 112 off of the carrying surface 1104 of membrane substrate 1002. As will also be seen, lift holes 1008 can be larger than the moveable lifts 1102, which can allow the moveable lifts 1102—and thus the DUT 112—to move in the "x,y" plane and/or rotate about the "z" axis with respect to membrane substrate 1002. Of course, the greater the difference between the size of the lift holes 1008 and the moveable lifts 1102, the greater the distance the moveable lifts 1102 can move with respect to membrane carrier 1002. In some embodiments, each lift hole 1008 can be 1.25, 1.5, 1.75, 2.8, or more times the size of a moveable lift 1102.

Membrane carrier 1000 as shown in FIGS. 10A and 10B is an example only. Thus, for example, membrane carrier 1000 need not include all of the features or elements illustrated in FIGS. 10A and 10B; membrane carrier 1000 can have additional features or elements not shown in FIGS. 10A and 10B; and membrane carrier 1000 can have different features or elements than shown in FIGS. 10A and 10B. For example, as shown in FIG. 10B, membrane carrier 1000 can include one or more temperature control devices 210 (which are described above). Alternatively, membrane carrier 1000 does not include temperature control device 210. As another example, membrane carrier 1000 can include a cover and sealing mechanism (not shown) that can provide a self-contained, clean-room environment around DUT 112. As still another example, DUT 112 can be clamped to the carrying surface 1004 of membrane substrate 1002 by other types of clamping mechanisms such as, for example, a mechanical clamp or the like. Vacuum grooves 1006 can thus be replaced with another type of clamping mechanism. As yet another example, the number, placement, and pattern of lift holes 1008 and/or carrier alignment features 118 can be different than shown in FIGS. 10A and 10B.

FIGS. 11A and 11B illustrate an example of a configuration of aligner 104 that can be used to align DUT 112 on membrane carrier 1000 according to some embodiments of the invention. As shown, aligner 104 of FIGS. 11A and 11B can include a housing 302 with access door 122 as generally discussed above with respect to FIG. 3. Aligner 104 can also include one or more cameras 304, camera mount 310 with camera alignment features 312, and a moving mechanism 314 for moving camera mount 310 as also generally discussed above with respect to FIG. 3. Aligner 104 of FIGS. 11A and 1B can also include a controller 308 and memory 316 also as discussed above with respect to FIG. 3. Different than FIG. 3, however, the embodiment of aligner 104 illustrated in FIGS. 11A and 11B can include a stage 1104 and moveable lifts 1102, which can be examples of moving mechanism 306 in FIG. 3.

As shown in FIGS. 11A and 11B, stage 1104 can hold membrane carrier 1000. Membrane carrier 1000 can thus be placed on stage 1104 as shown in FIG. 11A such that moveable lifts 1102 extend from stage 1104 into or through lift holes 1008 in membrane carrier 1000 also as shown in FIG. 11A. (In FIG. 11A, lift holes 1008 are shown in dashed lines because lift holes 1008 can be inside membrane substrate 1002 in the view shown in FIGS. 11A and 11B; portions of moveable lifts 1102 that are inside lift holes 1008 are also shown in dashed lines.) As noted above, DUT 112 can be clamped to and unclamped from carrying surface 1004 of membrane substrate 1002 by creating or releasing a vacuum in vacuum groves 1006.

Stage 1104 can including mechanisms (not shown) for moving moveable lifts 1102 along the "z" axis (which can be perpendicular to the carrying surface 1004 of membrane substrate 1002 as shown) and thus lift DUT 112 off of the carrying surface 1004 as shown in FIG. 11B. Stage 1104 can also include mechanisms (not shown) for moving moveable lifts 1102 in the "x,y" plane (which can be parallel to the carrying surface 1004 of membrane substrate 1002 as shown) and/or rotating moveable lifts 1102 about the "z" axis. As discussed above, to the extent that the lift holes 1008 in the membrane substrate 1002 are larger than the moveable lifts 1102, stage 1104 can thus move DUT 112 in the "x,y" plane and/or rotate DUT 112 about the "z" axis with respect to membrane substrate 1002. DUT 112 can be moved with respect to membrane substrate 1002 a distance greater than the difference in size of lift holes 1008 and moveable lifts 1102 by repeating two or more times the following: with moveable lifts 1102 in a first position within lift holes 1008, lifting DUT 112 off of the carrying surface 1004 of membrane substrate 1002, moving moveable lifts 1102 (and thus DUT 112) with respect to membrane substrate 1002, lowering DUT 112 back onto the carrying surface 1004, and moving moveable lifts 1102 back into the first position within lift holes 1008. Thus, while there is not a vacuum in vacuum grooves 1006 and DUT 112 is thus unclamped from the carrying surface 1004 of membrane substrate 1002, stage 1104 can move DUT 112 into an aligned position with respect to alignment features 118 on the carrying surface 1004 of membrane substrate 1002 by moving moveable lifts 1102.

As shown in FIGS. 11A and 11B, moving mechanism 314 can move camera alignment features 312 of camera mount 310 into and out of mechanical coupling with carrier alignment features 118. As generally discussed above, cameras 304 can be in known positions with respect to camera alignment features 312 and thus also with carrier alignment features 118 while camera alignment features 312 and carrier alignment features 118 are coupled. Images of DUT alignment features 212 (which as discussed above can be portions of terminals 114) obtained by cameras 304 can thus be used to move DUT 112 into the aligned position on the carrying surface 1004 of membrane substrate 1002.

As noted above, aligner 104 need not include features (e.g., camera alignment features 312) that couple cameras 304 to carrier alignment features 118. For example, cameras 304 can be mounted to housing 302 or other structures (not shown) in housing 302. In such a case, the positions of cameras 304 may not be known with respect to carrier alignment features 118, and cameras 304 can capture images of both DUT alignment features 212 (e.g., ones of terminals 114) and carrier alignment features 118, and those images can be used by controller 308 (and/or a human operator) to move DUT 112 into an aligned position on carrier 116. As another example, cameras 304 can be in known positions with respect to alignment features 118 and alignment features (not shown but can be like camera alignment features 312) of a clamp (not shown) or similar device that is in housing 302 but not directly coupled to cameras 304. Those alignment features (not shown) of the clamp or other device (not shown) can couple with carrier alignment features 118 and thereby move membrane carrier 1000 into a position in which carrier alignment features 118 are in known positions with respect to cameras 304.

The configuration of aligner 104 shown in FIGS. 11A and 11B is an example only. Thus, for example, aligner 104 need not include all of the features or elements illustrated in FIGS. 11A and 11B; aligner 104 can have additional features or elements not shown in FIGS. 11A and 11B; and aligner 104 can have different features or elements than shown in FIGS. 11A and 11B. For example, as generally discussed above with respect to FIG. 3, aligner 104 need not include camera alignment features 312, camera mount 310, or moving mechanism 314 (e.g., cameras 304 can be mounted to housing 302 or another structure or structures (not shown) in housing 302). As another example, as discussed above, there can be a mechanical coupling mechanism (not shown) in housing 302 that mechanically couples with carrier alignment features 118 and thereby moves membrane carrier 1000 into a predetermined position with respect to cameras 304. As another example, although two cameras 304 are shown, there can alternatively be only one camera 304 or more than two cameras 304. As yet another example, there can be more or fewer moveable lifts 1102 that shown in FIGS. 11A and 11B, and the moveable lifts 1102 can be disposed in different positions or patterns than shown in FIGS. 11A and 11B.

FIGS. 12A and 12B illustrate an example of a configuration of test cell 110 that can be used to test a DUT 112/membrane carrier 1000 combination according to some embodiments of the invention. As shown, test cell 110 of FIGS. 12A and 12B can include a housing 402 with access door 124 as generally discussed above with respect to FIGS. 4A and 4B. Test cell 110 can also include electrical connections 404, a contactor 408 with probes 410, contactor alignment features 412, seals 414, and a pressure controller device 416 as also generally discussed above with respect to FIGS. 4A and 4B. Test cell 110 of FIGS. 12A and 12B can also include a controller 418 and memory 420 also as discussed above with respect to FIGS. 4A and 4B. Different than FIGS. 4A and 4B, however, the embodiment of test cell 110 illustrated in FIGS. 12A and 12B can include a chuck 1202 and a chuck lift 1204, which can be examples of lift 406 in FIGS. 4A and 4B. As shown in FIGS. 12A and 12B, stage 1104 can hold a DUT 112/membrane carrier 1000 combination with DUT having been moved into and clamped in an aligned position on the carrying surface 1004 of membrane substrate 1002 in the aligner 104 shown in FIGS. 11A and 11B. A DUT 112/membrane carrier 1000 can thus be placed on stage 1104 as shown in FIG. 11A.

Although not shown, guide mechanisms can be provided in housing 403 for guiding a DUT 112/membrane carrier 1000 in test cell 110 in an initial rough orientation so that, for example, carrier alignment features 118 are roughly but sufficiently aligned with contactor alignment features 412. Examples of such guide mechanisms (not shown) can include guide rails, stop structures, or the like (not shown).

As shown, chuck lift 1204 can move chuck 1202 such that carrier alignment features 118 are moved out of coupling with contactor alignment features 412 as shown in FIG. 12A. Chuck lift 1204 can also move chuck 1202 such that carrier alignment features 118 are moved into coupling with contactor alignment features 412 as shown in FIG. 12B. As discussed above, pressure controller 416 can increase or decrease the air pressure between contactor 408 and DUT 112.

The configuration of a test cell 110 illustrated in FIGS. 12A and 12B is an example only. Thus, for example, test cell 110 need not include all of the features or elements illustrated in FIGS. 12A and 12B; test cell 110 can have additional features or elements not shown in FIGS. 12A and 12B; and test cell 110 can have different features or elements than shown in FIGS. 12A and 12B. As another example, test cell 110 need not include pressure controller 416 or seals 414.

An example of a multi-DUT test system 100 according to some embodiments of the invention and various examples of embodiments of elements of multi-DUT test system 100 have been illustrated and described above. Examples of processes for testing DUTs 112 in multi-DUT test system 100 will now be discussed with regard to FIGS. 13-15. Multi-DUT test system 100 is not limited, however, to operation in accordance with the processes illustrated in FIGS. 13-15, which are provided for purposes of illustration.

As generally discussed above, multiple DUTs 112 can be tested in multi-DUT test system 100 by aligning a DUT 112 on a carrier 116 in an aligner 104 and then loading the DUT 112/carrier 116 combination into a test cell 110, where DUT 112 is tested. As will be seen, multi-DUT test system 100 is not limited to testing multiple DUTs 112 serially. Rather, multi-DUT test system 100 is capable of testing multiple DUTs 112 in parallel.

FIG. 13 illustrates a process 1300 for operating multi-DUT test system 100 of FIG. 1 according to some embodiments of the invention. In some embodiments, process 1300 can run on controller 126. For example, operating in accordance with program code stored in memory 128 and/or hardwired circuitry (not shown), controller 126 can implement process 1300. Thus, process 1300 can be embodied in whole or in part as program code stored in memory 128. Alternatively, process 1300 can run on other equipment not shown in FIG. 1. As yet another alternative, process 1300 can be performed in whole or in part by a human operator.

Multiple DUTs 112 (e.g., two, three, five, ten, twenty, or more) can be in multi-DUT test system 100 at any given time, and the DUTs 112 can be at different points in the system 100. Referring to FIG. 13, process 1300 can comprise a loop or similar operational feature (e.g., an interrupt driven operational feature) in which process 1300 waits for an indication that one or more DUTs 112 is at a particular point in multi-DUT test system 100 in which the DUT 112 is ready to move to a different point. Examples of three such points are illustrated in FIG. 13. At step 1302, process 1300 can determine whether there is one or more new DUTs 112. A new DUT 112 can be, for example, a DUT 112 loaded into loader 102. At step 1306, process 1300 can determine whether one or more DUTs 112 have been aligned to a carrier 116 in aligner 104, and at step 1310, process 1300 can determine whether one or more DUTs 112 have completed testing in a test cell 110.

At step 1302, process 1300 can determine whether there is a new DUT 112 (or DUTs 112) ready to be tested. When a new DUT 112 is loaded into loader 102, loader 102 can send a signal, message, or the like to controller 126. Step 1302 can thus be implemented, for example, by determining whether such a signal or message has been received from loader 102. As another example, process 1300 can query loader 102 at step 1302 to determine whether there is one or more new DUTs 112. If process determines at step 1302 that there is a new DUT 112 ready to be tested, process 1300 can initiate at step 1304 a process of aligning the new DUT 112 on a carrier 116 in aligner 104. As will be seen, process 1400 of FIG. 14 is an example of a process for aligning a DUT 112 in aligner 104, and process 1300 can, at step 1304, initiate process 1400.

At step 1306, process 1300 can determine whether there is a DUT 112 in aligner 104 that has been moved to an aligned position on a carrier 116. When aligner 104 completes a process of aligning a DUT 112 to a carrier 116, aligner 104 can send a signal, message, or the like to controller 126. Step 1306 can thus be implemented, for example, by determining whether such a signal or message has been received from aligner 104. As another example, process 1300 can query aligner 104 at step 1306 to determine whether there is a DUT 112 in an aligned position on a carrier 116 in aligner 104. If process determines at step 1306 that there is a DUT 112 in an aligned position on a carrier 116 in aligner 104, process 1300 can initiate at step 1308 a process of testing the aligned DUT 112 in a test cell 110. As will be seen, process 1500 of FIG. 15 is an example of a process for testing a DUT 112 in a test cell 110, and process 1300 can, at step 1308, initiate process 1500.

At step 1310, process 1300 can determine whether there is a DUT 112 in test cell 110 for which testing has completed. When a test cell 110 completes a process of testing a DUT, the test cell 110 can send a signal, message, or the like to controller 126. Step 1310 can thus be implemented, for example, by determining whether such a signal or message has been received from a test cell 110. As another example, process 1300 can query test cells 110 at step 1310 to determine whether testing has completed in a test cell 110. If process determines at step 1310 that there is a tested DUT 112 in a test cell 110, process 1300 can initiate at step 1312 post-test processing of the tested DUT, which can be as simple as removing the tested DUT 112 from the test system 100 or can include obtaining information about the DUT 112. As will be seen, process 1600 of FIG. 16 is an example of a process for post-test processing of a tested DUT 112, and process 1300 can, at step 1312, initiate process 1600.

Still referring to FIG. 13, as shown, process 1300 can include step 1314 of setting a temperature for DUT 112. The temperature can be, for example, a temperature at which DUT 112 will be tested in test cell 110. Step 1314 is shown floating in FIG. 3 because step 1314 can be executed at any time during process 1300. For example, step 1314 can be executed after DUT 112 is placed on a carrier 116 but before DUT 112 is aligned on the carrier 116 so that DUT 112 is at approximately the temperature at which DUT 112 will tested in test cell 110. As another example, step 1314 can be executed any time after DUT 112 is aligned to a carrier 116 (e.g., as initiated at step 1304) but prior to the DUT 112/carrier 116 combination being loaded into a test cell 110 (e.g., as initiated at step 1308). Regardless of when performed, step 1314 can comprise activating temperature control device 210 (see FIGS. 3, 5A, 5B, and 10) to bring DUT 112 to a desired temperature (e.g., the temperature at which DUT 112 will be tested in test cell 110). In some embodiments, process 1300 need not include step 1314 or step 1314 need to be performed during a give execution of process 1300.

Process 1300 is but an example of an embodiment of a process for testing DUTs 112 in multi-DUT test system 100. For example, process 1300 can have additional steps not shown in FIG. 13; process 1300 need not have all of the steps shown in FIG. 13; process 1300 can have different steps that shown in FIG. 13; and/or the order of the steps shown in figure 1300 can be different.

As mentioned, FIG. 14 illustrates an example of a process 1400 for aligning a DUT 112 on a carrier 116 in aligner 104, and process 1400 can be started at step 1304 of process 1300. In some embodiments, process 1400 can be performed by controller 308 of aligner 104 and/or controller 126 of test system 100. For example, step 1402 can be implemented by controller 126, and steps 1404-1410 can be implemented by controller 308. In some embodiments, process 1400 can be implemented by controller 308 and/or controller 126 operating in accordance with program code stored in memory 316, memory 128, and/or hardwired circuitry (not shown). Thus, process 1400 can be embodied in whole or in part as program code stored in memory 316 and/or 128. Alternatively, process 1400 can run on other equipment not shown in the figures. As yet another alternative, process 1400 can be performed in whole or in part by a human operator.

As mentioned, process 1400 can be started by process 1300 at step 1304 after process 1300 determines at step 1302 that there is a new DUT to be tested. As shown in FIG. 14, at step 1402, the new DUT 112 can be loaded into aligner 104. The new DUT 112 can be loaded into aligner 104 in any manner described above. For example, the new DUT 112 can be placed on a carrier 116 outside of aligner 104 (e.g., in loader 102), and the DUT 112/carrier 116 combination can be loaded into aligner 104. Alternatively, the new DUT 112 can be loaded into aligner 104 and placed on a carrier 116 that is already in the aligner 104. Regardless, mover 106 including a robotic arm 120 can move the new DUT 112 or the combination of a DUT 112/carrier 116 from loader 102 to aligner 104. The result can be a DUT 112/carrier 116 combination in aligner 104 as illustrated in FIG. 3; a DUT 112/puck carrier 500 combination in which puck 502 is disposed in cavity 606 with puck alignment features 510 coupled to cavity alignment features as shown in FIG. 7B; or a DUT 112/membrane carrier 1000 combination in which membrane substrate 1002 is disposed on stage 1104 as shown in FIG. 11A.

If aligner 104 is not available (e.g., there is another DUT in aligner 104), process 1400 can be configured to move the new DUT 112 to a holding place (not shown) or leave DUT 112 in the loader 102 until the aligner 104 becomes available. As noted above, there can be more than one aligner 104 in multi-DUT test system 100.

As discussed above with respect to FIG. 3, aligner 104 can include a camera system that comprises a moving mechanism 314 and one or more cameras 304 coupled to a camera mount 310 that has camera alignment features 312. At step 1404, process 1400 can dock the camera system so that the cameras 304 are in known positions relative to the carrier 116. For example, in the embodiment of aligner 104 shown in FIG. 3, moving mechanism 314 can move camera mount 310 such that camera alignment features 312 couple with carrier alignment features 118 as shown in FIG. 3. As discussed above, cameras 304 are then in known positions with respect to carrier alignment features 118. As another example, in the embodiment of aligner 104 shown in FIGS. 6A and 6B (which utilizes the puck carrier 500 illustrated in FIGS. 5A-5C), moving mechanism 314 can move camera mount 310 such that camera alignment features 312 couple with chuck alignment features 620 as shown in FIG. 7B. As discussed above, cameras 304 are then in known positions with respect to chuck alignment features 620. As yet another example, in the embodiment of aligner 104 shown in FIGS. 11A and 11B (which utilizes the membrane carrier 10000 illustrated in FIGS. 10A and 10B), moving mechanism 314 can move camera mount 310 such that camera alignment features 312 couple with carrier alignment features 118 as shown in FIGS. 11A and 11B. As discussed above, cameras 304 are then in known positions with respect to carrier alignment features 118.

Step 1404 can alternatively be performed by moving coupling mechanisms (not shown) of clamps or other devices (not shown) in aligner 104 into coupling with carrier alignment features 118 as discussed above. Such coupling mechanisms (not shown) can be in known positions with respect to cameras 304, and the coupling with carrier alignment features 118 can move the carrier alignment features 118—and thus carrier 116 (including any embodiment of carrier 116 disclosed herein such as puck carrier 500 and membrane carrier 1000)—into known positions with respect to cameras 304.

As discussed above, however, some embodiments of aligner 104 can have a camera system that lacks docking capability. For example, such embodiments of aligner 104 can comprise one or more cameras 304 mounted to the housing 302 or another structure of the aligner 104 but lack camera alignment features 312. Step 1404 can be skipped or left out of process 1400 for such embodiments of aligner 104.

At step 1406 of FIG. 14, process 1400 can obtain images (e.g., digital images) of all or part of DUT 112 and/or carrier 116 as need to align DUT 112 on carrier 116. If the camera system in aligner 104 has docking capability as discussed above with respect to step 1404, process 1400 can obtain only images of DUT alignment features 212. (As noted above, in the figures, DUT alignment features 212 are all or part of one or more of terminals 114 of DUT 112, but alignment features 212 can be distinct structures, shapes, markings, or the like with known offsets from one or more of terminals 114.) Because the cameras 304 are in known locations with respect to carrier 116, DUT 112 can be aligned on carrier 112 using only images of alignment features 212.

If, on the other hand, aligner 104 lacks the docking capability discussed above with respect to step 1404, process 1400 can obtain at step 1406 images of DUT alignment features 212 and alignment features on carrier 116 at step 1406. For example, if the embodiment of aligner 104 shown in FIG. 3 did not include camera alignment features 312, images of DUT alignment features 212 and carrier alignment features 118 can be obtained at step 1406. As another example, if the embodiment of aligner 104 shown in FIGS. 6A and 6B did not include camera alignment features 312, images of DUT alignment features 212 and chuck alignment features 620 can be obtained at step 1406. As yet another example, if the embodiment of aligner 104 shown in FIGS. 11A and 1B did not include camera alignment features 312, images of DUT alignment features 212 and carrier alignment features 118 can be obtained at step 1406.

Regardless of how step 1406 is performed, in some embodiments, images captured by cameras 304 can include all or a portion of the edge 130 of DUT 112. For example, the images can comprise all of the edge 130 or a portion of the edge 130 that includes orientation mark 132, which as discussed above, can be an irregular portion of the edge 130. In such an embodiment, step 1406 can include identifying positions of alignment features 212 (e.g., terminals 114) of DUT 112 with respect to part or all of the edge 130 of DUT 112. For example, step 1406 can include identifying positions of alignment features 212 (e.g., terminals 114) of DUT 112 with respect to the orientation feature 132 (e.g., an irregular portion of edge 130). Also as part of step 1406, those identified positions can be stored (e.g., in memory (e.g., memory 316 and/or memory 128) and utilized in a future execution of process 1400 to find alignment features 212 (e.g., terminals 114) of a future DUT 112 being aligned in aligner 104. For example, process 1400 can find alignment features 212 (e.g., terminals 114) on the next DUT 112 being aligned in aligner 104 by finding the edge 130 or part (e.g., the orientation mark 132) of the edge 130 of the DUT 112 in images captured by cameras 304 and then locating the alignment features 212 utilizing the stored positions of the alignment features 212 with respect to the edge 130 or part (e.g., the orientation mark 132) of the edge 130 of the previous DUT 112.

At step 1408 of FIG. 14, process 1400 can utilize the images obtained at step 1406 to move DUT 112 into an aligned position on carrier 116. In the embodiment of aligner 104 illustrated in FIG. 3, step 1406 can be accomplished as follows. Clamping mechanism 208 can release DUT 112 so that DUT 112 is free to move on the carrying surface 204 of carrier 116. Moving mechanism 306 can then move DUT 112 relative to carrier 116 until DUT is in an aligned position on carrier 116. As discussed above, moving mechanism 306 can actually move DUT 112, carrier 116, or both DUT 112 and carrier 116. Once DUT 112 is in an aligned position on carrier 116, clamping mechanism 208 can be engaged to clamp DUT 112 in the aligned position on carrier 116.

In the embodiment of aligner 104 illustrated in FIGS. 6A and 6B for use with puck carrier 500, step 1408 can be accomplished as follows. With reference to FIG. 7B, the vacuum in vacuum grooves 506 in the carrying surface 504 of puck 502 can be released so that DUT 112 is free to move on the carrying surface 504, and a vacuum can be created in vacuum groves 614 in the upper surface 604 of chuck 602 so that DUT 112 is clamped to the upper surface 604. Chuck 602 can then move DUT 112 relative to puck 502 until DUT is in an aligned position on puck carrier 500. Once DUT 112 is in an aligned position on puck carrier 500, DUT 112 can be clamped to the carrying surface 504 of puck 502 by creating a vacuum in vacuum grooves 506. The vacuum in vacuum groves 614 can be released, releasing DUT 112 from the upper surface 604 of chuck 602. As noted above, vacuum grooves 506 and/or vacuum grooves 614 can be replaced with another type of clamping mechanism such as mechanical clamps or the like.

In the embodiment of aligner 104 illustrated in FIGS. 10A and 10B for use with membrane carrier 1000, step 1408 can be accomplished as follows. With reference to FIG. 11A, the vacuum in vacuum grooves 1006 in the carrying surface 1004 of membrane substrate 1002 can be released so that DUT 112 is free to move on the carrying surface 1004. Moveable lifts 1102 can then lift DUT 112 off of the carrying surface 1004 of membrane substrate 1002 as shown in FIG. 11B. Stage 1104 can move moveable lifts 1102—and thus DUT 112—with respect to carrier alignment features 118 until DUT is in an aligned position with respect to carrier alignment features 118 on membrane carrier 1000. Moveable lifts 1102 can then lower DUT 112 back onto the carrying surface 1004 of membrane substrate 1102. The foregoing can be repeated as needed until DUT 112 is in an aligned position on membrane carrier 1000. DUT 112 can then be clamped to the carrying surface 1004 in the aligned position by creating a vacuum in vacuum grooves 1006. As noted above, vacuum grooves 1006 can be replaced with another type of clamping mechanism such as mechanical clamps or the like.

After step 1408, DUT 112 is clamped to carrier 116 in an aligned position. As noted above, "aligned" or "aligned position" means that DUT 112 is positioned on carrier 116 (or any embodiment of carrier 116 described herein including puck carrier 500 and membrane carrier 1000) with respect to alignment features (e.g., carrier alignment features 118 or puck alignment features 510) of the carrier that will dock with corresponding contactor alignment features (e.g., contactor alignment features 412 or cavity alignment features 810) in test cell 110 such that terminals 114 of DUT 112 are sufficiently aligned with probes 410 of contactor 408 that terminals 114 and probes 410 make contact and thereby establish electrical connections.

At step 1410, process 1400 can send a signal or message that alignment is completed. For example, process 1400 can send such a signal or message to controller 126, which can then cause process 1300 of FIG. 13 to make an affirmative determination at the next execution of step 1306 and branch to step 1308 to load the carrier 116/DUT combination into a test cell 110.

Process 1400 is but an example of an embodiment of a process for aligning a DUT 112 on a carrier 116 in aligner 104. For example, process 1400 can have additional steps not shown in FIG. 14; process 1400 need not have all of the steps shown in FIG. 14; process 1400 can have different steps that shown in FIG. 13; and/or the order of the steps shown in figure 1400 can be different. For example, steps 1406 and 1408 can be repeated as needed during an execution process 1400. For example, during execution of process 1400, images of DUT alignment features 212 can be captured at step 1406, DUT 112 can be moved on carrier 116 at step 1408, and new images of DUT alignment features 212 captured by repeating step 1406. Steps 1408 and then 1406 can then be repeated until the DUT 112 is in an aligned position on carrier 116 as indicated by the new images of DUT alignment features 212 obtained at step 1406.

As mentioned, FIG. 15 illustrates an example of a process 1500 for testing in a test cell 110 a DUT 112 aligned on a carrier 116. In some embodiments, process 1500 can be performed by controller 418 of test cell 110 and/or controller 126 of test system 100. For example, step 1502 can be implemented by controller 126, and steps 1504-1510 can be implemented by controller 418. In some embodiments, process 1500 can be implemented by controller 418 and/or controller 126 operating in accordance with program code stored in memory 420, memory 128, and/or hardwired circuitry (not shown). Thus, process 1500 can be embodied in whole or in part as program code stored in memory 420 and/or memory 128. Alternatively, process 1500 can run on other equipment not shown in the figures. As yet another alternative, process 1500 can be performed in whole or in part by a human operator.

As mentioned, process 1500 can be started by process 1300 at step 1308 after process 1300 determines at step 1306 that a DUT 112 has been aligned on a carrier 116 in aligner 104. As shown in FIG. 15, a DUT 112/carrier 116 combination aligned by aligner 104 can be removed from aligner 104 and loaded into a test cell 110 at step 1502. The DUT 112/carrier 116 combination can be removed from aligner 104 and loaded into test cell 110 in any manner described above. For example, mover 106 including one or more robotic arms 120 can remove the DUT 112/carrier 116 combination from aligner 104 and load the DUT 112/carrier 116 combination into a test cell 110. The result can be a DUT 112/carrier 116 combination in test cell 110 as illustrated in FIG. 4A; a DUT 112/puck carrier 500 combination in which puck 502 is disposed in cavity 806 with puck alignment features 510 coupled to cavity alignment features 810 as shown in FIG. 9B; or a DUT 112/membrane carrier 1000 combination with membrane substrate 102 disposed on chuck 1202 with carrier alignment features 118 coupled to contactor alignment features 512 as shown in FIG. 12B.

If no test cell 110 is available (e.g., there are DUT 112/carrier 116 combinations in all test cells 110), process 1500 can be configured to move the DUT 112/carrier 116 combination from aligner 104 to a holding place (not shown) or leave the DUT 112/carrier 116 combination in the aligner 104 until a test cell 110 becomes available.

At step 1504, process 1500 can dock carrier 116 (with DUT 112 clamped in an aligned position on the carrier 116) in test cell 110 so that terminals 114 of DUT are aligned with probes 410 of contactor 408. In the embodiment of test cell 110 illustrated in FIGS. 4A and 4B, step 1504 can be accomplished by moving carrier 116 such that carrier alignment features 118 couple with contactor alignment features 412 as shown in FIG. 4B. As noted above, DUT 112 was aligned to carrier 116 so that the coupling of carrier alignment features 118 and contactor alignment features 412 align terminals 114 and probes 410.

In the embodiment of test cell 110 illustrated in FIGS. 8A and 8B, step 1504 can be accomplished by causing chuck lift 816 to move chuck 802—and thus the DUT 112/puck carrier 500 combination—such that chuck alignment features 820 couple with contactor alignment features 412 as shown in FIG. 9B. As noted above, chuck alignment features 820 can be in the same positions with respect to puck alignment features 510 as chuck alignment features 620 so that terminals 114 and probes 410 align when puck alignment features 510 are coupled with cavity alignment features 810 in test cell 110. Alternatively, alignment features 820 can be in known offset positions with respect to puck alignment features 510 as compared to chuck alignment features 620. In some embodiments of the test cell 110 configured for use with a puck carrier 500 (see FIGS. 8A and 8B), contactor 408 can be coupled to test cell in a position in which terminals 114 and probes 410 are aligned while puck alignment features 510 are coupled with cavity alignment features 810. In such embodiments, chuck alignment features 820 and contactor alignment features 412 need not be used or included in test cell 110.

In the embodiment of test cell 110 illustrated in FIGS. 12A and 12B, step 1504 can be accomplished by causing chuck lift 1204 to move chuck 1202—and thus the DUT 112/membrane carrier 1000 combination—such that carrier alignment features 118 couple with contactor alignment features 412 as shown in FIG. 12B. As noted above, DUT 112 was aligned to membrane carrier 1000 so that the coupling of carrier alignment features 118 and contactor alignment features 412 aligns terminals 114 and probes 410.

At step 1506, contact between terminals 114 and probes 410 can be adjusted as needed or desired. For example, contact can be adjusted or regulated to ensure that electrical connections of sufficient conductivity are created between the terminals 114 and the probes 410 to properly test DUT 112. As another example, contact can be adjusted or regulated so that forces on the terminals 114 and/or probes 410 are kept within ranges that are unlikely to damage the terminals 114, DUT 112, or probes 410. As discussed above, test cell 110 can include air-tight seals 414 between contactor 408 and DUT 110, and a pressure controller 416 device can selectively control the air pressure in the space between contactor 408 and DUT 110 to selectively move contactor 408 and DUT 110 closer together or farther apart, which can change the force of contact between terminals 114 and probes 410.

At step 1508, DUT 110 can be tested. For example, as discussed above, test signals can be provided through probes 410 to DUT 110, and response signals generated by DUT in response to the test signals can be obtained from DUT 110 through probes 410. Test signals (including, e.g., power and ground, control signals, data signals, and the like) can be generated by circuitry (not shown) on contactor 408 and/or provided from other equipment (not shown) through electrical connections 404 to contactor 408. Response signals can be evaluated to determine if DUT 110 is operating as expected by circuitry (not shown) on contactor 408 and/or provided to other equipment (not shown) through electrical connections 404.

At step 1510, process 1500 can send a signal or message that testing is completed. For example, process 1500 can send such a signal or message to controller 126, which can then cause process 1300 of FIG. 13 to make an affirmative determination at the next execution of step 1310 and branch to step 1312 to remove the tested DUT 112 and carrier 116 from test cell 110.

Process 1500 is but an example of an embodiment of a process for testing a DUT 112 on in a test cell 110. For example, process 1500 can have additional steps not shown in FIG. 15; process 1500 need not have all of the steps shown in FIG. 15; process 1500 can have different steps that shown in FIG. 15; and/or the order of the steps shown in FIG. 15 can be different.

As mentioned, FIG. 16 illustrates an example of a process 1600 for post-test processing of a DUT 112. In some embodiments, process 1600 can be performed by controller 126 of test system 100, controller 308 of aligner 104, and/or controller 418 of a test cell 110. In some embodiments, process 1600 can be implemented by controller 126, controller 308, and/or controller 418 operating in accordance with program code stored in memory 128, memory 316, memory 420, and/or hardwired circuitry (not shown). Thus, process 1600 can be embodied in whole or in part as program code stored in memory 128, memory 316, and/or memory 420. Alternatively, process 1600 can run on other equipment not shown in the figures. As yet another alternative, process 1600 can be performed in whole or in part by a human operator.

As mentioned, process 1600 can be started by process 1300 at step 1312 after process 1300 determines at step 1310 that testing of a DUT 112 has completed in a test cell 110. As shown in FIG. 16, data can be obtained at step 1602 regarding the testing. For example, data representing results of testing the DUT 112 can be obtained at step 1602. As another example, data indicating positions of scrub marks on terminals 114 of DUT 112 created by contact with probes 410 can be obtained at step 1402. In some embodiments, this can be accomplished by removing the DUT 112/carrier 116 combination from the test cell 110 and loading the DUT 112/carrier 116 combination into aligner 104. Cameras 304 in aligner 104 can then be utilized to capture images of terminals 114. Scrub marks (not shown) on the terminals 114 can be obtained from the captured images, and the positions of the scrub marks on the terminals 114 can be stored (e.g., in a digital memory). The positions of the scrub marks on the terminals 114 can be utilized to adjust the process (e.g., process 1400) of aligning new DUTs 112 on a carrier 116 in aligner 104. For example, if the scrub marks (not shown) are not in a desired position on the terminals 114 of the tested DUT 112, the alignment position to which future DUTs 112 are moved to on carriers 116 in aligner 104 can be adjusted so that the scrub marks made on the terminals of those DUTs 112 are in the desired position.

At step 1604, the tested DUT 112 can be removed from carrier 116 and then from test system 100. For example, the tested DUT 112 can be removed from carrier 116 in the test cell 110, in aligner 104, in loader 102, on mover 106, or in another place in test system 100. The DUT 112/carrier 116 combination and/or the DUT 112, in which the DUT 112 is a tested DUT 112, can be moved about test system 100 in any manner described above. For example, mover 106 including one or more robotic arms 120 can move the DUT 112/carrier 116 combination and/or the DUT 112 about test system 100.

Process 1600 is but an example of an embodiment of a process for post-test processing of a tested DUT 112. For example, process 1600 can have additional steps not shown in FIG. 16; process 1600 need not have all of the steps shown in FIG. 16; process 1600 can have different steps that shown in FIG. 16; and/or the order of the steps shown in FIG. 16 can be different.

In implementing processes 1300, 1400, 1500, and 1600, a first DUT 112 can be loaded into aligner 104 at step 1304, and the first DUT 112 can be moved in aligner 104 to an aligned position on a first carrier 116, for example, by process 1400. The combination of the first DUT 112/first carrier 116 can then be loaded into a first test cell 110 at step 1308, where the first DUT 112 can be tested, for example, by process 1500. A second DUT 112 can be loaded into aligner 104 at step 1304 (e.g., after the first DUT/first carrier 116 has been removed from the aligner), and the second DUT 112 can be moved in aligner 104 to an aligned position on a second carrier 116, for example, by process 1400. The loading of the second DUT 112 into aligner 104 at step 1304 can occur before testing of the first DUT in the first test cell 110 has completed (e.g., by the process 1500). Indeed, the moving of the second DUT 112 into an aligned position on the second carrier 116 (e.g., by the process 1400) can occur before testing of the first DUT in the first test cell 110 (e.g., by the process of 1500) has completed. The combination of the second DUT 112/second carrier 116 can be loaded into a second test cell 110 at step 1308, where the second DUT 112 can be tested, for example, by process 1500. The testing of the second DUT 112 (e.g., by process 1500) in the second test cell 110 can start before the testing of the first DUT 112 (e.g., by process 1500) in the first test cell 110 has completed. Process 1300 can initiate multiple instances of processes 1400, 1500, and 1600 such that there can be multiple DUT 112s and DUT 112/carrier 116 combinations at various places in test system 100 at any given time. For example, there can be multiple DUT 112/carrier 116 combinations being tested in different test cells 110 while aligner 104 is aligning a DUT 112 to a carrier 116 in aligner 104.

Although specific embodiments and applications of the invention have been described in this specification, these embodiments and applications are exemplary only, and many variations are possible.

We claim:

1. A process of testing DUTs in a test system comprising an aligner and test cells, said process comprising:
   positioning in said aligner a first DUT on a first carrier in an aligned position in which electrically conductive terminals of said first DUT are in a predetermined position with respect to carrier alignment features of said first carrier;
   clamping said first DUT on said first carrier in said aligned position;
   while said first DUT is clamped on said first carrier in said aligned position, loading said first carrier into a housing of a first one of said test cells, a guide mechanism in said housing guiding said first carrier into an initial position in which said carrier alignment features are uncoupled from but generally aligned with contactor alignment features of a first contactor comprising electrically conductive probes;
   while said first DUT is clamped on said first carrier in said aligned position and said first carrier is in said initial position in said housing of said first test cell, mechanically coupling said carrier alignment features of said first carrier with said contactor alignment features of said first contactor, said coupling aligning said terminals of said first DUT with said probes of said first contactor; and
   testing said first DUT in said first test cell by providing signals to and from said DUT through said first contactor.

2. The process of claim 1 further comprising, before completing said testing of said first DUT, positioning in said aligner a second DUT on a second carrier in an aligned position in which electrically conductive terminals of said second DUT are in a predetermined position with respect to carrier alignment features of said second carrier.

3. The process of claim 2 further comprising:
   clamping said second DUT on said second carrier in said aligned position;
   while said second DUT is clamped on said second carrier in said aligned position, moving said second carrier to a second one of said test cells, said second test cell comprising a second contactor comprising electrically conductive probes and contactor alignment features;
   while said second DUT is clamped on said second carrier in said aligned position, mechanically coupling said carrier alignment features of said second carrier with said contactor alignment features of said second contactor, said coupling aligning said terminals of said second DUT with said probes of said second contactor; and
   testing said second DUT in said second test cell by providing signals to and from said second DUT through said second contactor.

4. The process of claim 3, wherein said moving said second carrier and said coupling said second carrier occur before completing said testing of said first DUT.

5. The process of claim 4, wherein said testing said second DUT starts before completing said testing of said first DUT.

6. A process of testing DUTs in a test system comprising an aligner and test cells, said process comprising:

positioning in said aligner a first DUT on a first carrier in an aligned position in which electrically conductive terminals of said first DUT are in a predetermined position with respect to carrier alignment features of said first carrier;

clamping said first DUT on said first carrier in said aligned position;

while said first DUT is clamped on said first carrier in said aligned position, moving said first carrier to a first one of said test cells, said first test cell comprising a first contactor comprising electrically conductive probes and contactor alignment features;

while said first DUT is clamped on said first carrier in said aligned position, mechanically coupling said carrier alignment features of said first carrier with said contactor alignment features of said first contactor, said coupling aligning said terminals of said first DUT with said probes of said first contactor;

testing said first DUT in said first test cell by providing signals to and from said DUT through said first contactor;

mechanically coupling a camera system to said carrier alignment features of said first carrier, wherein cameras of said camera system are in predetermined positions with respect to said carrier alignment features while said camera system and said carrier alignment features are coupled; and capturing with said cameras images of DUT alignment features on said first DUT, wherein said positioning said first DUT on said first carrier comprises utilizing said images to move said first DUT until said DUT alignment features are in a predetermined position with respect to said carrier alignment features.

7. The process of claim 1, wherein said positioning said first DUT on said first carrier comprising:

disposing said first carrier with said first DUT clamped thereto on a chuck in said aligner;

unclamping said first DUT from said first carrier;

clamping said first DUT to said chuck; and moving said chuck and said first DUT.

8. The process of claim 7, wherein:

said first carrier comprises a puck with a carrying surface that is smaller than said first DUT; and said disposing said first carrier on said chuck comprises disposing said puck in a cavity in a surface of said chuck, wherein said first DUT is disposed in part on said carrying surface of said puck and in part on said surface of said chuck.

9. The process of claim 1, wherein:

said carrier alignment features comprise one of extensions or receptacles, said contactor alignment features comprise the other of extension or receptacles, and said mechanically coupling said carrier alignment features with said contactor alignment features comprises inserting said extensions into said receptacles, which mechanically aligns said terminals to said probes.

10. The process of claim 9, wherein said inserting said extensions into said receptacles kinematically aligns said terminals to said probes.

11. The process of claim 1 further comprising activating a temperature control device on said first carrier to bring said first DUT to a predetermined temperature, wherein said first DUT is at said temperature before said moving of said first carrier to said first test cell.

12. The process of claim 1, wherein said first DUT is a semiconductor wafer comprising unsingulated semiconductor dies.

13. The process of claim 12, wherein said positioning said first DUT on said first carrier comprises capturing with cameras disposed in said aligner images of DUT alignment features on said semiconductor wafer, wherein said process further comprises storing in a digital memory device positions of said DUT alignment features with respect to at least a portion of an edge of said semiconductor wafer.

14. A process of testing DUTs in a test system comprising an aligner and test cells, said process comprising:

positioning in said aligner a first DUT on a first carrier in an aligned position in which electrically conductive terminals of said first DUT are in a predetermined position with respect to carrier alignment features of said first carrier;

clamping said first DUT on said first carrier in said aligned position;

while said first DUT is clamped on said first carrier in said aligned position, moving said first carrier to a first one of said test cells, said first test cell comprising a first contactor comprising electrically conductive probes and contactor alignment features;

while said first DUT is clamped on said first carrier in said aligned position, mechanically coupling said carrier alignment features of said first carrier with said contactor alignment features of said first contactor, said coupling aligning said terminals of said first DUT with said probes of said first contactor; and testing said first DUT in said first test cell by providing signals to and from said DUT through said first contactor, wherein said positioning said first DUT on said first carrier comprising:

disposing said first carrier with said first DUT clamped thereto on a stage in said aligner;

unclamping said first DUT from said first carrier;

lifting, with moveable lifts that extend from said stage through holes in said first carrier, said DUT off of a carrying surface of said first carrier; and moving in a plane generally parallel to said carrying surface said moveable lifts relative to said first carrier and thereby moving said DUT in said plane into said aligned position; and lowering, with said moveable lifts, said first DUT onto said carrying surface of said carrier in said aligned position.

15. A process of testing DUTs in a test system comprising an aligner and test cells, said process comprising:

positioning in said aligner a first DUT on a first carrier in an aligned position in which electrically conductive terminals of said first DUT are in a predetermined position with respect to carrier alignment features of said first carrier;

clamping said first DUT on said first carrier in said aligned position;

while said first DUT is clamped on said first carrier in said aligned position, moving said first carrier to a first one of said test cells, said first test cell comprising a first contactor comprising electrically conductive probes and contactor alignment features;

while said first DUT is clamped on said first carrier in said aligned position, mechanically coupling said carrier alignment features of said first carrier with said contactor alignment features of said first contactor, said coupling aligning said terminals of said first DUT with said probes of said first contactor;

testing said first DUT in said first test cell by providing signals to and from said DUT through said first contactor;

after said testing, determining positions of scrub marks on said terminals of said first DUT caused by contact with said probes; and changing said aligned position for subsequent repetitions of said process for additional DUTs.

16. The process of claim 1, wherein:
said loading comprises loading said first carrier through an access door in said housing and then closing said access door, and
said housing and said access door are sufficiently sealed to provide, while said access door is closed, a self-contained clean room enclosure inside said housing.

17. A DUT test system comprising:
an aligner comprising a moving mechanism configured to position a DUT on a carrier in an aligned position in which electrically conductive terminals of said DUT are in a predetermined position with respect to carrier alignment features of said carrier;
test cells, each said test cell comprising a housing and a guide mechanism and a contactor disposed inside said housing, said contactor comprising electrically conductive probes and contactor alignment features, wherein said guide mechanism guides said carrier into an initial position in which said carrier alignment features are uncoupled from but generally aligned with said contactor alignment features and mechanically coupling said carrier alignment features of said carrier with said contactor alignment features of said contactor aligns said terminals of said DUT with said probes of said contactor; and
a mover comprising a robotic mechanism configured to remove said carrier with said DUT clamped in said aligned position from said aligner to one of said test cells.

18. The test system of claim 17, wherein said aligner is distinct from and operates independently of each of said test cells.

19. The test system of claim 18, wherein said moving mechanism of said aligner can position a first said DUT on a first said carrier while a second said carrier with a second said DUT is in one of said test cells.

20. The test system of claim 17, wherein said carrier comprises a clamping mechanism configured selectively to clamp said DUT in place on said carrier and to release said DUT from said carrier so that said DUT can move with respect to said carrier.

21. A DUT test system comprising:
an aligner comprising a moving mechanism configured to position a DUT on a carrier in an aligned position in which electrically conductive terminals of said DUT are in a predetermined position with respect to carrier alignment features of said carrier;
test cells, each said test cell comprising a contactor, said contactor comprising electrically conductive probes and contactor alignment features, wherein mechanically coupling said carrier alignment features of said carrier with said contactor alignment features of said contactor aligns said terminals of said DUT with said probes of said contactor; and a mover comprising a robotic mechanism configured to remove said carrier with said DUT clamped in said aligned position from said aligner to one of said test cells,
wherein:
said carrier comprises a puck with a carrying surface that is smaller than said DUT; and
said aligner further comprises a first moveable chuck comprising:
a first surface; and
a first cavity in said first surface, said first cavity configured to receive said puck, wherein, while said puck is disposed in said first cavity, a DUT disposed on said carry surface is also disposed on said first surface of said first chuck.

22. The test system of claim 21, wherein said first cavity comprises alignment features configured to couple mechanically with corresponding alignment features on a surface of said puck that is opposite said carrying surface.

23. The test system of claim 22, wherein said movable chuck comprises vacuum grooves in said first surface configured to clamp and unclamp selectively said DUT to said first surface of said chuck.

24. The test system of claim 22, wherein each test cell further comprises a second moveable chuck comprising:
a second surface; and
a second cavity in said second surface, said second cavity configured to receive said puck, wherein, while said puck is disposed in said second cavity, a DUT disposed on said carry surface is also disposed on said second surface of said second chuck.

25. The test system of claim 24, wherein said second cavity comprises alignment features configured to couple mechanically with said alignment features on said surface of said puck that is opposite said carrying surface.

26. The test system of claim 17, wherein
said carrier alignment features comprise one of extensions or receptacles,
said contactor alignment features comprise the other of extension or receptacles, and
inserting said extensions into said receptacles mechanically aligns said terminals to said probes.

27. The test system of claim 26, wherein said inserting said extensions into said receptacles kinematically aligns said terminals to said probes.

28. A DUT test system comprising:
an aligner comprising a moving mechanism configured to position a DUT on a carrier in an aligned position in which electrically conductive terminals of said DUT are in a predetermined position with respect to carrier alignment features of said carrier;
test cells, each said test cell comprising a contactor, said contactor comprising electrically conductive probes and contactor alignment features, wherein mechanically coupling said carrier alignment features of said carrier with said contactor alignment features of said contactor aligns said terminals of said DUT with said probes of said contactor; and
a mover comprising a robotic mechanism configured to remove said carrier with said DUT clamped in said aligned position from said aligner to one of said test cells,
wherein said aligner further comprises a camera system comprising:
camera alignment features that can couple mechanically with said carrier alignment features; and cameras disposed in predetermined positions with respect to said camera alignment features.

29. The test system of claim 17, wherein said carrier further comprises a temperature control device.

30. The test system of claim 17, wherein said DUT is a semiconductor wafer comprising unsingulated semiconductor dies.

31. A DUT test system comprising:
   an aligner comprising a moving mechanism configured to position a DUT on a carrier in an aligned position in which electrically conductive terminals of said DUT are in a predetermined position with respect to carrier alignment features of said carrier;
   test cells, each said test cell comprising a contactor, said contactor comprising electrically conductive probes and contactor alignment features, wherein mechanically coupling said carrier alignment features of said carrier with said contactor alignment features of said contactor aligns said terminals of said DUT with said probes of said contactor; and
   a mover comprising a robotic mechanism configured to remove said carrier with said DUT clamped in said aligned position from said aligner to one of said test cells,
   wherein said moving mechanism of said aligner comprises:
      a stage configured to hold said carrier with said DUT disposed on said carrier; and
      moveable lifts extending from said stage and configured to lift said DUT off of said carrying surface of said carrier while said carrier is disposed on said stage, wherein said moveable lifts are moveable in a plane that is generally parallel with said carrying surface while said DUT is disposed on said stage.

32. The test system of claim 17, wherein said carrier comprises a puck with a carrying surface that is at least fifty percent smaller than said DUT.

33. The test system of claim 17, wherein said carrier comprises a membrane substrate with a thickness that is less than a thickness of said DUT.

34. The test system of claim 17 further comprising at least four of said test cells.

35. The test system of claim 17, wherein:
   each said test cell further comprises an access door, and
   said housing and said access door are sufficiently sealed to provide, while said access door is closed, a self-contained clean room enclosure inside said housing.

* * * * *